US009059278B2

(12) United States Patent
Campi, Jr. et al.

(10) Patent No.: US 9,059,278 B2
(45) Date of Patent: Jun. 16, 2015

(54) HIGH VOLTAGE LATERAL DOUBLE-DIFFUSED METAL OXIDE SEMICONDUCTOR FIELD EFFECT TRANSISTOR (LDMOSFET) HAVING A DEEP FULLY DEPLETED DRAIN DRIFT REGION

(71) Applicant: International Business Machines Corporation, Armonk, NY (US)

(72) Inventors: John B. Campi, Jr., Westford, VT (US); Robert J. Gauthier, Jr., Hinesburg, VT (US); Junjun Li, Williston, VT (US); Rahul Mishra, Essex Junction, VT (US); Souvick Mitra, Essex Junction, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/959,777

(22) Filed: Aug. 6, 2013

(65) Prior Publication Data
US 2015/0041890 A1   Feb. 12, 2015

(51) Int. Cl.
H01L 29/66 (2006.01)
H01L 29/78 (2006.01)
H01L 29/08 (2006.01)

(52) U.S. Cl.
CPC ........ *H01L 29/7816* (2013.01); *H01L 29/0878* (2013.01); *H01L 29/66659* (2013.01); *H01L 29/66681* (2013.01); *H01L 29/7801* (2013.01); *H01L 29/7835* (2013.01)

(58) Field of Classification Search
None
See application file for complete search history.

(56) References Cited

U.S. PATENT DOCUMENTS

| 5,146,298 | A |   | 9/1992 | Eklund |
| 5,286,995 | A |   | 2/1994 | Malhi |
| 5,485,027 | A | * | 1/1996 | Williams et al. ............... 257/343 |
| 6,729,886 | B2 |  | 5/2004 | Efland et al. |
| 6,876,035 | B2 |  | 4/2005 | Abadeer et al. |
| 6,903,421 | B1 |  | 6/2005 | Huang et al. |
| 6,995,428 | B2 |  | 2/2006 | Huang et al. |
| 7,087,973 | B2 |  | 8/2006 | Mallikarjunaswamy et al. |
| 7,122,876 | B2 |  | 10/2006 | Wu et al. |
| 7,224,025 | B2 |  | 5/2007 | Tsai et al. |
| 7,355,224 | B2 |  | 4/2008 | Cai |

(Continued)

FOREIGN PATENT DOCUMENTS

| CN | 102130168 A | 7/2011 |
| CN | 102569392 A | 7/2012 |

*Primary Examiner* — Michael Lebentritt
*Assistant Examiner* — Jordan Klein
(74) *Attorney, Agent, or Firm* — Gibb & Riley, LLC; Michael J. LeStrange, Esq.

(57) ABSTRACT

Disclosed are semiconductor structures. Each semiconductor structure can comprise a substrate and at least one laterally double-diffused metal oxide semiconductor field effect transistor (LDMOSFET) on the substrate. Each LDMOSFET can have a fully-depleted deep drain drift region (i.e., a fully depleted deep ballast resistor region) for providing a relatively high blocking voltage. Different configurations for the drain drift regions are disclosed and these different configurations can also vary as a function of the conductivity type of the LDMOSFET. Additionally, each semiconductor structure can comprise an isolation band positioned below the LDMOSFET and an isolation well positioned laterally around the LDMOSFET and extending vertically to the isolation band such that the LDMOSFET is electrically isolated from both a lower portion of the substrate and any adjacent devices on the substrate.

7 Claims, 14 Drawing Sheets

(56) References Cited

U.S. PATENT DOCUMENTS

| | | |
|---|---|---|
| 7,553,733 B2 | 6/2009 | Tsai et al. |
| 7,671,423 B2 | 3/2010 | Voldman |
| 8,114,745 B2 | 2/2012 | Wu et al. |
| 2004/0106236 A1 | 6/2004 | Hu et al. |
| 2005/0017300 A1* | 1/2005 | Salama et al. ............... 257/342 |
| 2007/0262386 A1* | 11/2007 | Gossner et al. ............... 257/355 |
| 2008/0138954 A1 | 6/2008 | Cai |
| 2008/0237704 A1* | 10/2008 | Williams et al. .............. 257/338 |
| 2011/0101453 A1 | 5/2011 | Lin et al. |
| 2011/0115016 A1 | 5/2011 | Cha et al. |
| 2011/0260246 A1 | 10/2011 | Disney et al. |
| 2012/0104468 A1 | 5/2012 | Li et al. |
| 2012/0280317 A1 | 11/2012 | Lee et al. |

* cited by examiner

HIGH VOLTAGE LATERAL DOUBLE-DIFFUSED METAL OXIDE SEMICONDUCTOR FIELD EFFECT TRANSISTOR (LDMOSFET) HAVING A DEEP FULLY DEPLETED DRAIN DRIFT REGION

BACKGROUND

The semiconductor structures disclosed herein relate to lateral double-diffused metal oxide semiconductor field effect transistors (LDMOSFETS) and, more particularly, LDMOSFETS having a relatively deep, fully-depleted, drain drift region for providing ballasting resistance.

Typically, an LDMOSFET, like a conventional MOSFET, comprises a channel region positioned laterally between a source region and a drain region. However, unlike the conventional MOSFET, the LDMOSFET is asymmetrical. Specifically, the drain region of the LDMOSFET is separated from the channel region by a relatively low-doped drain drift region, which provides ballasting resistance so that the LDMOSFET has a relatively high blocking voltage (i.e., a high maximum voltage that can be applied to the transistor). However, as operating voltages and device densities increase, LDMOSFETs with even higher blocking voltages and better transistor-to-substrate and/or transistor-to-transistor isolation are needed to prevent device failures.

SUMMARY

In view of the foregoing, disclosed herein are semiconductor structures. Each semiconductor structure can comprise a substrate and a laterally double-diffused metal oxide semiconductor field effect transistor (LDMOSFET) on the substrate. Each LDMOSFET can have a fully depleted deep drain drift region (i.e., a fully depleted deep ballast resistor region) for providing a relatively high blocking voltage. Different configurations for the drain drift regions are disclosed and these different configurations can also vary as a function of the conductivity type of the LDMOSFET. Additionally, each semiconductor structure can comprise an isolation band positioned below the LDMOSFET and an isolation well positioned laterally around the LDMOSFET and extending vertically to the isolation band such that the LDMOSFET is electrically isolated from both a lower portion of the substrate and any adjacent devices on the substrate.

More particularly, disclosed herein is a semiconductor structure comprising a semiconductor substrate. This semiconductor substrate can have a first type conductivity at a relatively low conductivity level (e.g., a P− substrate).

The semiconductor structure can further comprise a transistor (e.g., a P-type lateral double-diffused metal oxide semiconductor field effect transistor (PLDMOSFET)) on the substrate. Specifically, the transistor can comprise a plurality of intra-transistor wells within the substrate. These intra-transistor wells can comprise a first intra-transistor well having the first type conductivity (e.g., a P-well); a second intra-transistor well positioned laterally adjacent to the first intra-transistor well and having a second type conductivity (e.g., an N-well); a third intra-transistor well positioned laterally adjacent to the second intra-transistor well and having the first type conductivity (e.g., another P-well); and a fourth intra-transistor well positioned laterally adjacent to the third intra-transistor well and having the second type conductivity (e.g., another N-well).

The transistor can further comprise, within the substrate at the top surface, a drain region, a source region, one or more contact regions and a trench isolation structure that electrically isolates these regions. Specifically, the transistor can comprise a drain region within the first intra-transistor well at the top surface of the substrate and a source region within the fourth intra-transistor well at the top surface of the substrate. The drain region and the source region can each have the first type conductivity at a relatively high conductivity level (e.g., a P+ drain region and a P+ source region). The transistor can comprise a contact region within the fourth intra-transistor well at the top surface of the substrate. This contact region can have the second type conductivity at a relatively high conductivity level (e.g., an N+ contact region). Optionally, this transistor can further comprise another contact region, having the second type conductivity at a relatively high conductivity level (e.g., another N+ contact region), within the second intra-transistor well at the top surface of the substrate. As mentioned above, the drain region, source region and any contact regions can be electrically isolated by a trench isolation structure.

The transistor can also comprise an intra-transistor band in the substrate below and in contact with the first intra-transistor well, the second intra-transistor well, the third intra-transistor well and the fourth intra-transistor well. This intra-transistor band can have the first type conductivity (e.g., a P-band).

The semiconductor structure can further comprise, within the substrate, a first isolation well, a second isolation well and an isolation band. The first isolation well can be positioned laterally around (i.e., can border) the transistor and can have the second type conductivity (e.g., an N-type isolation well). The second isolation well can be positioned laterally between the fourth intra-transistor well and the first isolation well, can have the first type conductivity (e.g., a P-type isolation well) and can extend vertically to the intra-transistor band. The second isolation band can be below and in contact with the first isolation well and the intra-transistor band and can have the second type conductivity (e.g., an N-type isolation band) such that the transistor is electrically isolated from both a lower portion of the substrate and adjacent devices on the substrate.

In such a semiconductor structure, the transistor will have a fully depleted deep drain drift region located within the intra-transistor band between the second intra-transistor well and the isolation band. This fully depleted drain drift region will ensure that the transistor has a relatively high blocking voltage.

Also disclosed herein is another semiconductor structure comprising a semiconductor substrate. This semiconductor substrate can have a first type conductivity at a relatively low conductivity level (e.g., a P− substrate).

The semiconductor structure can further comprise a transistor (e.g., a P-type lateral double-diffused metal oxide semiconductor field effect transistor (PLDMOSFET)) on the substrate. Specifically, the transistor can comprise a plurality of intra-transistor wells within the substrate. These intra-transistor wells can comprise a first intra-transistor well having the first type conductivity (e.g., a P-well) and a second intra-transistor well positioned laterally adjacent to the first intra-transistor well and having a second type conductivity (e.g., an N-well).

This transistor can further comprise, within the substrate at the top surface, a drain region, a source region, one or more contact regions and a trench isolation region that electrically isolates these regions. Specifically, the transistor can comprise a drain region within the first intra-transistor well at the top surface of the substrate and a source region within the second intra-transistor well at the top surface of the substrate. The drain region and the source region can each have the first type conductivity at a relatively high conductivity level (e.g., a P+ drain region and a P+ source region). The transistor can comprise a contact region within the second intra-transistor well at the top surface of the substrate. This contact region can have the second type conductivity at a relatively high conductivity level (e.g., an N+ contact region). This transistor can also comprise another contact region, having the second type conductivity at a relatively high conductivity level (e.g., another N+ contact region), within the first intra-transistor well at the top surface of the substrate between the drain region and the second intra-transistor well. As mentioned above, the drain region, source region and any contact regions can be electrically isolated by a trench isolation structure.

The transistor can also comprise an intra-transistor band. This intra-transistor band can be positioned in the substrate below and in contact with the first intra-transistor well and the second intra-transistor well. This intra-transistor band can have the first type conductivity (e.g., a P-band).

The semiconductor structure can further comprise a first isolation well, a second isolation well, and an isolation band. The first isolation well can be positioned laterally around (i.e., can border) the transistor and can have the second type conductivity (e.g., an N-type isolation well). The second isolation well can be positioned laterally between the second intra-transistor well and the first isolation well, can have the first type conductivity (e.g., a P-type isolation well) and can extend vertically to the intra-transistor band. The isolation band can be below and in contact with the first isolation well and the intra-transistor band and can have the second type conductivity (e.g., an N-type isolation band) such that the transistor is electrically isolated from both a lower portion of the substrate and adjacent devices on the substrate.

In such a semiconductor structure, the transistor will have a fully depleted deep drain drift region located within the first intra-transistor well and the intra-transistor band between the contact region and the isolation band. This fully depleted drain drift region will ensure that the transistor has a relatively high blocking voltage.

Also disclosed herein is yet another semiconductor structure comprising a semiconductor substrate. This semiconductor substrate can have with a first type conductivity at a relatively low conductivity level (e.g., a P− substrate).

The semiconductor structure can further comprise a transistor (e.g., an N-type lateral double-diffused metal oxide semiconductor field effect transistor (NLDMOSFET)) on the substrate. Specifically, the transistor can comprise a plurality of intra-transistor wells within the substrate. These intra-transistor wells can comprise a first intra-transistor well in the substrate and having a second type conductivity (e.g., an N-well); a second intra-transistor well in the substrate within the first intra-transistor well and having the first type conductivity (e.g., a P-well); and a third intra-transistor well positioned laterally adjacent to the first intra-transistor well and having the first type conductivity (e.g., another P-well). In this case, the first intra-transistor well can extend a first depth into the substrate from the top surface, the second intra-transistor well can extend a second depth into the substrate from the top surface and the first depth can be deeper than the second depth (i.e., the second intra-transistor well can be a more shallow well than the first intra-transistor well).

This transistor can further comprise, within the substrate at the top surface, a drain region, a source region, one or more contact regions, and a trench isolation structure that electrically isolates these regions. Specifically, the transistor can comprise a drain region within the first intra-transistor well at the top surface of the substrate and a source region within the third intra-transistor well at the top surface of the substrate. The drain region and the source region can each have the second type conductivity at a relatively high conductivity level (e.g., a N+ drain region and a N+ source region). The transistor can also comprise a contact region within the third intra-transistor well. This contact region can have the first type conductivity at a relatively high conductivity level (e.g., a P+ contact region). Optionally, this transistor can further comprise another contact region, having the first type conductivity at a relatively high conductivity level (e.g., another P+ contact region), within the second intra-transistor well at the top surface of the substrate. As mentioned above, the drain region, source region and any contact regions can be electrically isolated by a trench isolation structure.

The semiconductor structure can further comprise, within the substrate, a first isolation band, a first isolation well, a second isolation well and a second isolation band. Specifically, the first isolation band can be positioned below and in contact with the first intra-transistor well. This first isolation band can have the first type conductivity (e.g., a P-type isolation band). The first isolation well can have the second type conductivity (e.g., an N-type isolation well) and can be positioned laterally around (i.e., can border) the transistor. The second isolation well can have the first type conductivity (e.g., a P-type isolation well) and can be positioned laterally between the first isolation well and the first intra-transistor well of the transistor and can extend vertically to the first isolation band. The second isolation band can be below the first isolation well, the first isolation band and the second intra-transistor well of the transistor and can have the second type conductivity (e.g., an N-type isolation band) such that the transistor is electrically isolated from a lower portion of the substrate and adjacent devices on the substrate.

In such a semiconductor structure, the transistor will have a fully depleted deep drain drift region located within the first intra-transistor well between the second intra-transistor well and the first isolation band. This fully depleted drain drift region will ensure that the transistor has a relatively high blocking voltage.

Also disclosed herein is yet another semiconductor structure comprising a semiconductor substrate with a first type conductivity at a relatively low conductivity level (e.g., a P− substrate).

The semiconductor structure can further comprise a transistor (e.g., an N-type lateral double-diffused metal oxide semiconductor field effect transistor (NLDMOSFET)) on the substrate. Specifically, the transistor can comprise a plurality of intra-transistor wells within the substrate. These intra-transistor wells can comprise a first intra-transistor well in the substrate and having a second type conductivity (e.g., an N-well) and a second intra-transistor well in the positioned laterally adjacent to the first intra-transistor well and having the first type conductivity (e.g., a P-well).

This transistor can further comprise, within the substrate at the top surface, a drain region, a source region, one or more contact regions and a trench isolation region electrically isolating those regions. Specifically, the transistor can further comprise a drain region within the first intra-transistor well at the top surface of the substrate and a source region within the second intra-transistor well at the top surface of the substrate. The drain region and the source region can each have the second type conductivity at a relatively high conductivity level (e.g., a N+ drain region and a N+ source region). The transistor can also comprise a contact region within the second intra-transistor well. This contact region can have the first type conductivity at a relatively high conductivity level (e.g., a P+ contact region). This transistor can also comprise another contact region, having the first type conductivity at a relatively high conductivity level (e.g., another P+ contact region), within the first intra-transistor well at the top surface of the substrate. As mentioned above, the drain region, source region and any contact regions can be electrically isolated by a trench isolation structure.

The semiconductor structure can further comprise, within the substrate, a first isolation band, a first isolation well, a second isolation well and a second isolation band. Specifically, the first isolation band can be positioned below and in contact with the first intra-transistor well. This first isolation band can have the first type conductivity (e.g., a P-band). The first isolation well can have the second type conductivity (e.g., an N-type isolation well) and can be positioned laterally around (i.e., can border) the transistor. The second isolation well can have the first type conductivity (e.g., a P-type isolation well) and can be positioned laterally between the first isolation well and the first intra-transistor well of the transistor and can extend vertically to the first isolation band. The second isolation band can be below the first isolation well, the first isolation band and the second intra-transistor well of the transistor and can have the second type conductivity (e.g., an N-band) such that the transistor is electrically isolated from a lower portion of the substrate and adjacent devices on the substrate.

In such a semiconductor structure, the transistor will have a fully depleted deep drain drift region located within the first intra-transistor well between the contact region and the first isolation band. This fully depleted drain drift region will ensure that the transistor has a relatively high blocking voltage.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
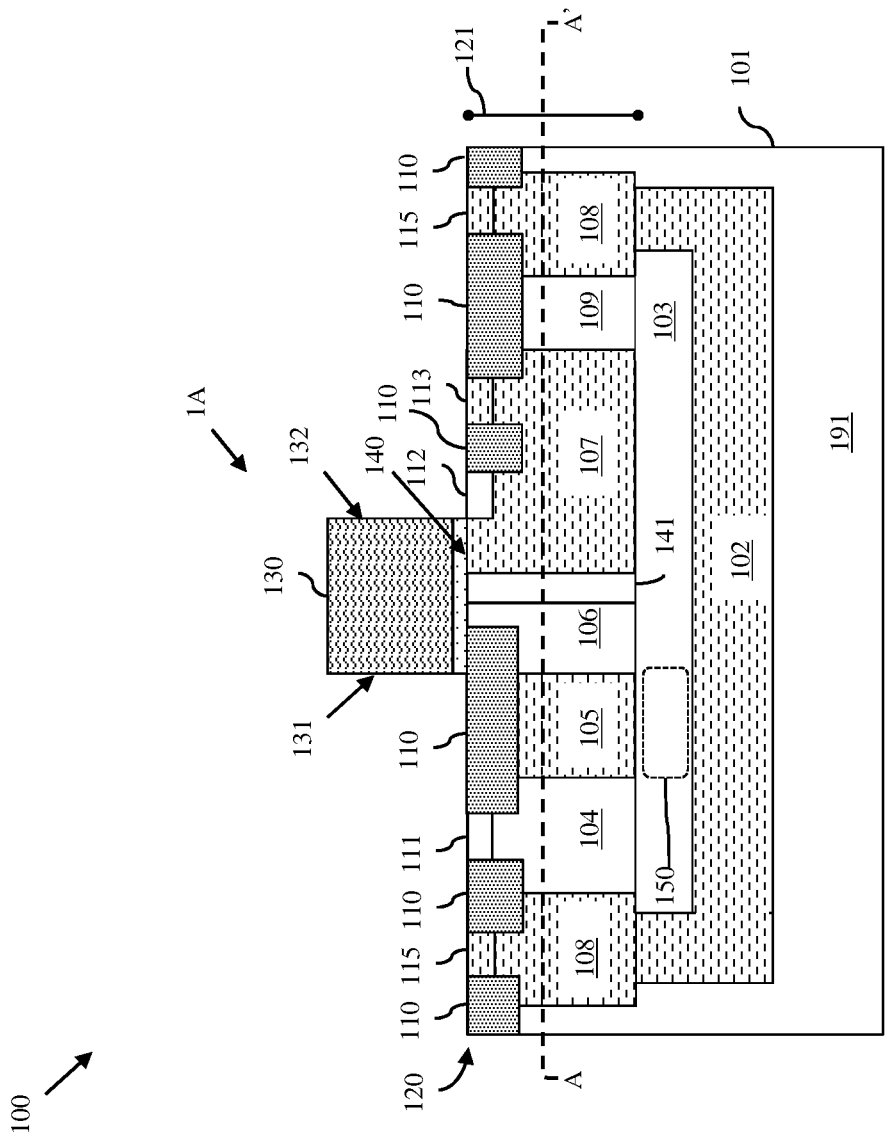
FIG. 1 is a vertical cross-section diagram illustrating a P-type lateral double-diffused metal oxide semiconductor field effect transistor.

As mentioned above, typically, a lateral double-diffused metal oxide semiconductor field effect transistor (LDMOS-FET), like a conventional MOSFET transistor, comprises a channel region positioned laterally between a source region and a drain region. However, unlike the conventional MOS-FET, the LDMOSFET is asymmetrical. Specifically, the drain region of the LDMOSFET is separated from the channel region by a relatively low-doped drain drift region, which provides ballasting resistance so that the LDMOSFET has a relatively high blocking voltage (i.e., a high maximum voltage that can be applied to the transistor). However, as operating voltages and device densities increase, LDMOSFETs with even higher blocking voltages and better transistor-to-substrate and/or transistor-to-transistor isolation are needed to prevent device failures.

In view of the foregoing, disclosed herein are semiconductor structures. Each semiconductor structure can comprise a substrate and a laterally double-diffused metal oxide semiconductor field effect transistor (LDMOSFET) on the substrate. Each LDMOSFET can have a fully depleted deep drain drift region (i.e., a fully depleted deep ballast resistor region) for providing a relatively high blocking voltage. Different configurations for the drain drift regions are disclosed and these different configurations can also vary as a function of the conductivity type of the LDMOSFET. Additionally, each semiconductor structure can comprise an isolation band positioned below the LDMOSFET and an isolation well positioned laterally around the LDMOSFET and extending vertically to the isolation band such that the LDMOSFET is electrically isolated from both a lower portion of the substrate and any adjacent devices on the substrate.

It should be noted that in the semiconductor structures described below, for illustration purposes, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different type conductivities and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having a N-type conductivity is typically doped with silicon (Si). Those skilled in the art will also recognize that different conductivity levels will depend upon the relative concentration levels of the dopants.

Figure 2:
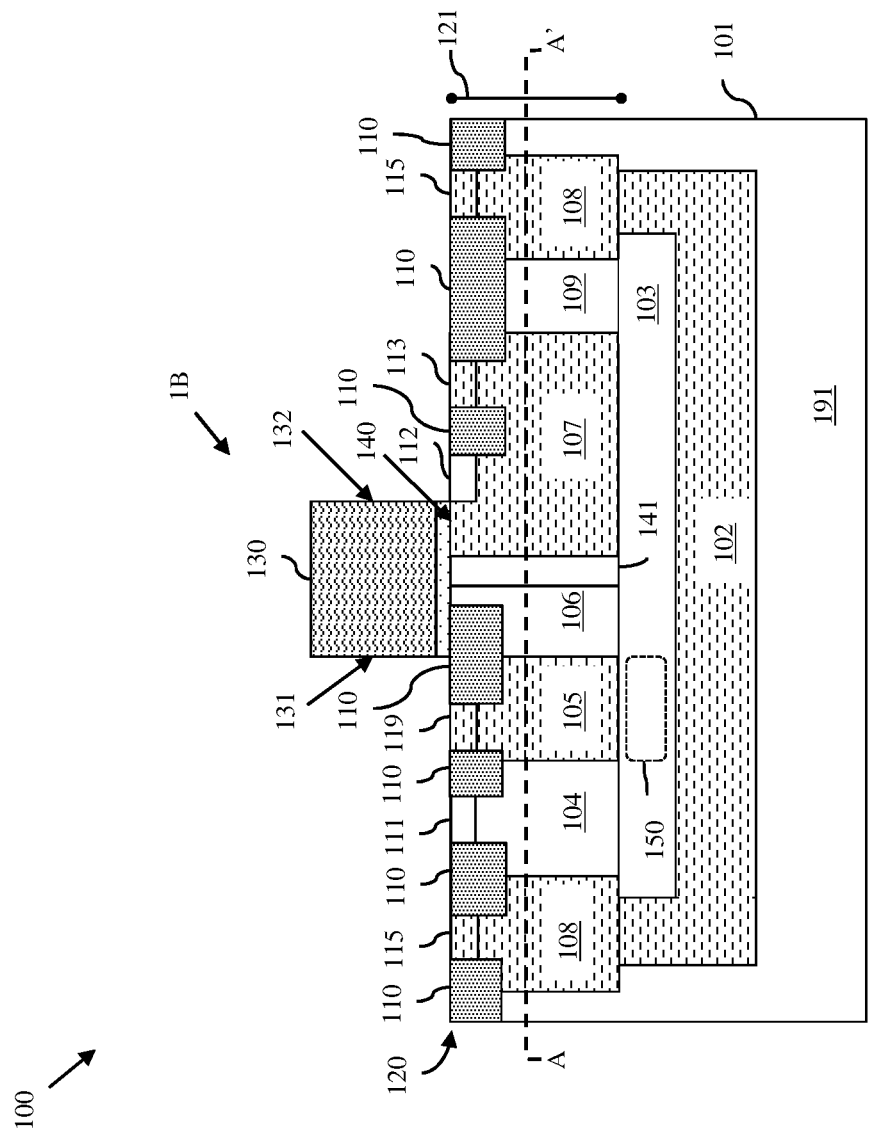
FIG. 2 is a vertical cross-section diagram illustrating another P-type lateral double-diffused metal oxide semiconductor field effect transistor.

Referring to FIGS. 1 and 2 disclosed herein is a semiconductor structure 100 comprising a bulk semiconductor substrate 101. For example, the semiconductor substrate 101 can comprise a bulk silicon substrate or any other bulk semiconductor substrate. The semiconductor substrate 101 can have a first type conductivity (e.g., P-type conductivity) at a relatively low conductivity level. For example, the semiconductor substrate 101 can comprise a P− substrate.

The semiconductor structure 100 can further comprise a transistor 1A, as in FIG. 1, or 1B, as in FIG. 2, on the semiconductor substrate 101 and, particularly, a P-type lateral double-diffused metal oxide semiconductor field effect transistor (PLDMOSFET) on the substrate 101.

Specifically, the transistor 1A, 1B can comprise a plurality of intra-transistor wells 104-107 within the substrate 101. For purposes of this disclosure, an "intra-transistor well" refers to a well (i.e., a dopant implant region), which is an active component of the transistor. These intra-transistor wells can comprise, for example, a first intra-transistor well 104 having the first type conductivity (e.g., a P-well); a second intra-transistor well 105 positioned laterally adjacent to the first intra-transistor well 104 and having a second type conductivity (e.g., an N-well); a third intra-transistor well 106 positioned laterally adjacent to the second intra-transistor well 105 and having the first type conductivity (e.g., another P-well); and a fourth intra-transistor well 107 positioned laterally adjacent to the third intra-transistor well 106 and having the second type conductivity (e.g., another N-well). Each of these intra-transistor wells 104-107 can be positioned at the top surface 120 of the semiconductor substrate 101 and can extend vertically into the semiconductor substrate 101 some predetermined depth (e.g., a same predetermined depth 121).

It should be noted that the third intra-transistor well 106 can be physically separated from the fourth intra-transistor well 107 by a space 141, as shown. In this case, the space 141 between the third intra-transistor well 106 and fourth intra-transistor well 107 will have the same doping type and conductivity level as the lower portion 191 of the substrate 101 (e.g., P−). Alternatively, the third intra-transistor well 106 can be immediately adjacent to (i.e., can abut) the fourth intra-transistor well 107 (not shown).

The transistor 1A, 1B can further comprise a gate structure 130 on the top surface 120 of the substrate 101. A first side 131 of the gate structure 130 can extend laterally over the third intra-transistor well 106. A second side 132 of the gate structure 130 can extend laterally over the fourth intra-transistor well 107 and can define the channel region 140 of the transistor 1A, 1B. The gate structure 130 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer.

The transistor 1A, 1B can further comprise, at the top surface 120 of the substrate 101 on either side of the gate structure 130, a drain region 111, a source region 112, various contact regions (e.g., 113 and, optionally, 119) and a trench isolation structure 110 that electrically isolates these regions.

Specifically, the drain region 111 can be positioned within the first intra-transistor well 104 at the top surface 120 of the substrate 101 adjacent to the first side 131 of the gate structure 130 and the source region 112 can be positioned within the fourth intra-transistor well 107 at the top surface 120 of the substrate 101 adjacent to the second side 132 of the gate structure 130. The drain region 111 and source region 112 can be asymmetric with respect to the gate structure 130 and, specifically, the drain region 111 can be positioned farther from the gate structure 130 than the source region 112, as shown. The drain region 111 and the source region 112 can each comprise doped regions having the first type conductivity at a relatively high conductivity level (e.g., a P+ drain region and a P+ source region).

Additionally, a contact region 113 (also referred to herein as a body contact region), having the second type conductivity at a relatively high conductivity level (e.g., an N+ contact region), can be positioned within the fourth intra-transistor well 107 at the top surface 120 of the substrate 101 so as to allow that fourth intra-transistor well 107 to be electrically biased. Within the fourth intra-transistor well, the source region 112 can be positioned closer to the gate structure 130 than the contact region 113. Optionally, as shown in FIG. 2, the transistor 1B can further comprise a contact region 119, having the second type conductivity at a relatively high conductivity level (e.g., an N+ contact region), within the second intra-transistor well 105 at the top surface 120 of the substrate 101 so as to effectively form a junction field effect transistor. Thus, the contact region 119 will be closer to the gate structure 130 than the drain region 111.

In any case, a patterned trench isolation structure 110 at the top surface 120 of the substrate 101 can electrically isolate the drain region 111, source region 112, and contact regions (e.g., the contact region 113 and, if applicable, the contact region 119). This trench isolation structure 110 can comprise, for example, a conventional shallow trench isolation (STI) structure) comprising a patterned trench, which is filled with one or more isolation materials (e.g., silicon dioxide ($SiO_2$), silicon nitride (SiN), silicon oxynitride (SiON), and/or any other suitable isolation material).

The transistor 1A, 1B can further comprise an intra-transistor band 103 within the substrate 101. For purposes of this disclosure, an "intra-transistor band" refers to a band (i.e., a buried dopant implant region within the substrate and separated from the top surface by some predetermined distance), which is an active component of the transistor. The intra-transistor band 103 can be positioned in the substrate 101 below and in contact with the first intra-transistor well 104, the second intra-transistor well 105, the third intra-transistor well 106 and the fourth intra-transistor well 107. This intra-transistor band 103 can have the first type conductivity (e.g., a P-band).

The semiconductor structure 100 can further comprise, within the substrate 101, a first isolation well 108, a second isolation well 109 and an isolation band 102. For purposes of this disclosure, an "isolation well" refers to a well (i.e., a dopant implant region) that electrically isolates adjacent devices and/or components thereof. Such isolation wells can be positioned at the top surface of the semiconductor substrate and can extend vertically into the semiconductor substrate some predetermined depth (e.g., the same predetermined depth 121 as the intra-transistor wells). For purposes of this disclosure, an "isolation band" refers to a band (i.e., a buried dopant implant region within the substrate and separated from the top surface by some predetermined distance), which electrically isolates devices and components thereof from the lower portion of the substrate.

Figure 3:
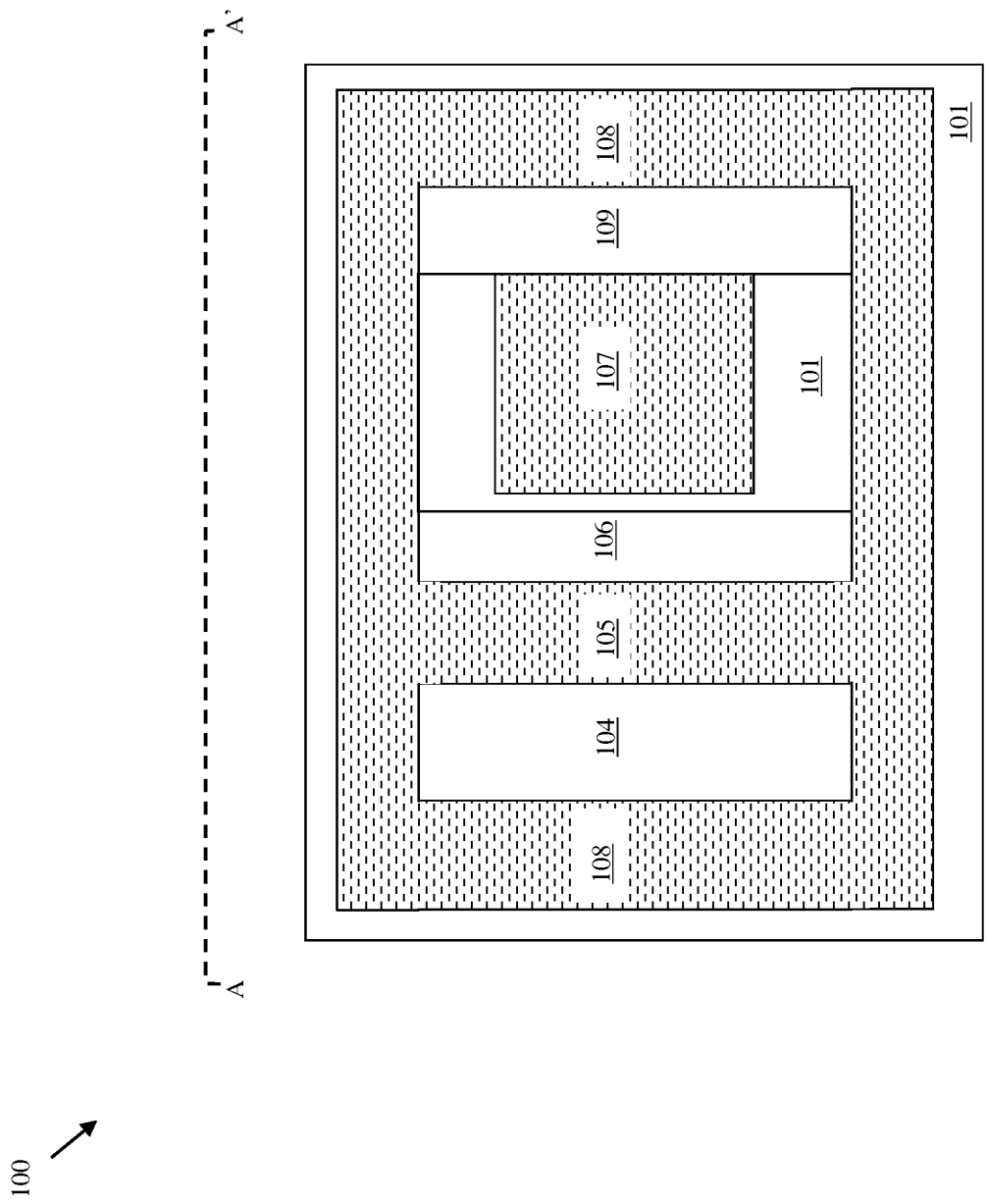
FIG. 3 is a horizontal cross-section diagram further illustrating the P-type lateral double-diffused metal oxide semiconductor field effect transistor of FIG. 1 or FIG. 2.

In this case, the first isolation well 108 can be positioned laterally around (i.e., can border) the transistor 1A, 1B (see the cross-section diagram of FIG. 3) and can have the second type conductivity (e.g., an N-type isolation well). The second isolation well 109 can be positioned laterally between the fourth intra-transistor well 107 and the first isolation well 108, can have the first type conductivity (e.g., a P-type isolation well), and can extend vertically to the intra-transistor band 103. The isolation band 102 can be below and in contact with the first isolation well 108 and the intra-transistor band 103. More specifically, the isolation band 102 can have vertical portion aligned below and in contact with the first isolation well 108. This vertical portion can further be positioned laterally around (i.e., can border) the intra-transistor band 103. Additionally, the isolation band 102 can have a horizontal portion that separates the bottom surface of the intra-transistor band 103 and the lower portion 191 of the substrate 101. This isolation band 102 can have the second type conductivity (e.g., an N-band). The isolation band 102 in combination with the first isolation well 108, which also has the second type conductivity, can electrically isolate the transistor 1A, 1B from the lower portion 191 of the substrate 101 and from any adjacent devices (not shown) on the substrate 101.

It should be noted that, optionally, the semiconductor structure 100 can further comprise an additional contact region 115 that allows the well 108 and, thereby the band 102 to be electrically biased. More specifically, the semiconductor structure 100 can further comprise a contact region 115, having the second type at a relatively high conductivity level (e.g., an N+ contact region), within the first isolation well 108 at the top surface of the substrate 101 so as to allow that isolation well 108 and, thereby the band 102 below to be electrically biased. As with the other contact regions 113, 119, described above, the contact region 115 can be electrically isolated by the trench isolation region 110.

In such a semiconductor structure 100, the transistor 1A, 1B will have a fully-depleted deep drain drift region 150 located within the intra-transistor band 103 between the second intra-transistor well 105 and the isolation band 102. This fully-depleted drain drift region 150 will ensure that the transistor 1A, 1B has a relatively high blocking voltage. Furthermore, because the transistor 1A, 1B is electrically isolated by the first isolation well 108 and isolation band 102 from the lower portion 191 of the substrate 101 and from adjacent devices on the substrate 101, the transistor 1A, 1B can be placed in relatively close proximity to adjacent devices in order to increase device density on the substrate 101 with minimal risk of shorts.

Figure 4:
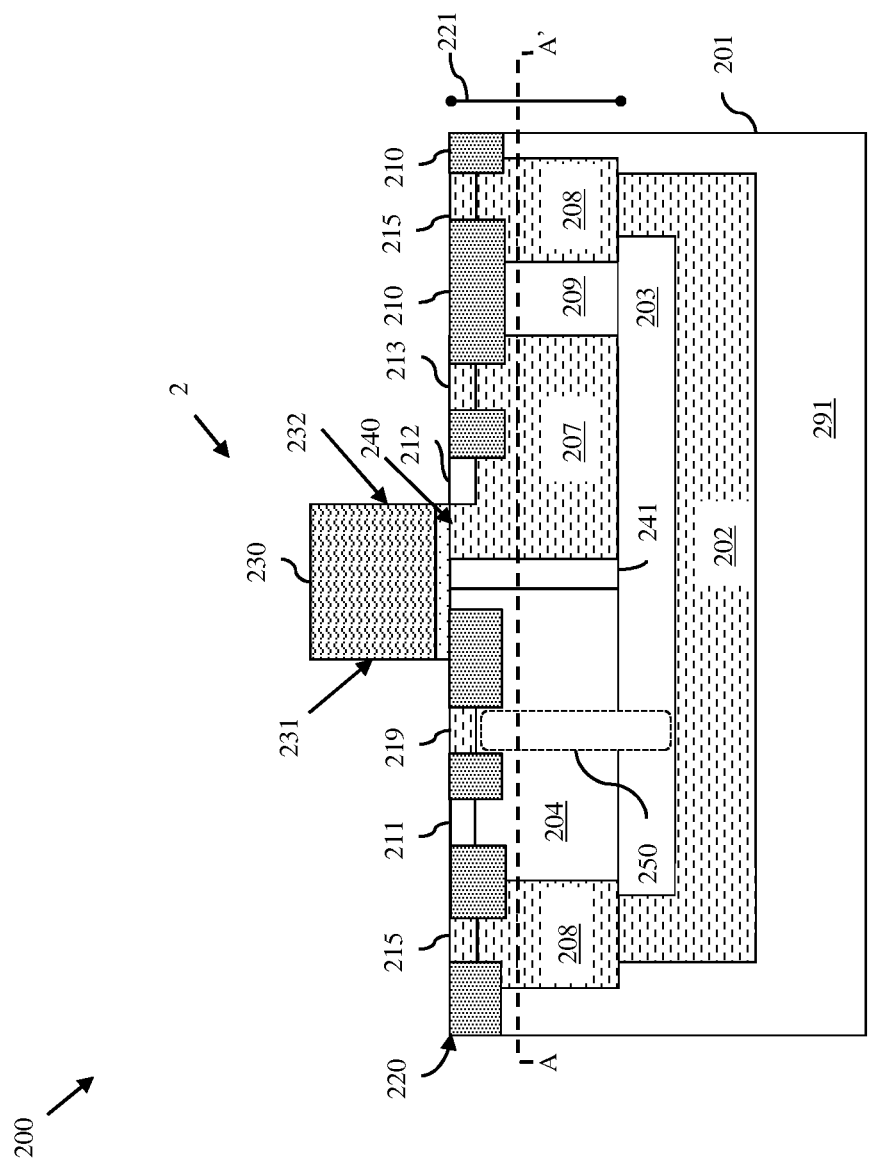
FIG. 4 is a vertical cross-section diagram illustrating yet another P-type lateral double-diffused metal oxide semiconductor field effect transistor.

Referring to FIG. 4, also disclosed herein is another semiconductor structure 200 comprising a bulk semiconductor substrate 201. For example, the semiconductor substrate 201 can comprise a bulk silicon substrate or any other bulk semiconductor substrate. The semiconductor substrate 201 can have a first type conductivity (e.g., P-type conductivity) at a relatively low conductivity level. For example, the semiconductor substrate 201 can comprise a P− substrate.

The semiconductor structure 200 can further comprise a transistor 2 on the semiconductor substrate 201 and, particularly, a P-type lateral double-diffused metal oxide semiconductor field effect transistor (PLDMOSFET) on the substrate 201.

Specifically, the transistor 2 can comprise a plurality of intra-transistor wells 204 and 207 within the substrate 201. For purposes of this disclosure, an "intra-transistor well" refers to a well (i.e., a dopant implant region), which is an active component of the transistor. These intra-transistor wells can comprise a first intra-transistor well 204 having the first type conductivity (e.g., a P-well) and a second intra-transistor well 207 positioned laterally adjacent to the first intra-transistor well 204 and having second type conductivity (e.g., an N-well). These intra-transistor wells 204 and 207 can be positioned at the top surface 220 of the semiconductor substrate 201 and can extend vertically into the semiconductor substrate 201 some predetermined depth (e.g., a same predetermined depth 221).

It should be noted that the first intra-transistor well 204 can be physically separated from the second intra-transistor well 207 by a space 241, as shown. In this case, the space 241 between the first intra-transistor well 204 and second intra-transistor well 207 will have the same doping type and conductivity level as the lower portion 291 of the substrate 201 (e.g., P−). Alternatively, the first intra-transistor well 204 can be immediately adjacent to (i.e., can abut) the second intra-transistor well 207.

The transistor 2 can further comprise a gate structure 230 on the top surface 220 of the substrate 201. A first side 231 of the gate structure 230 can extend laterally over the first intra-transistor well 204. A second side 232 of the gate structure 230 can extend laterally over the second intra-transistor well 207 and can define the channel region 240 of the transistor 2. The gate structure 230 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer.

The transistor 2 can further comprise, at the top surface 220 of the substrate 201 on either side of the gate structure 230, a drain region 211, a source region 212, various contact regions (e.g., 213 and 219) and a trench isolation structure 210 that electrically isolates these regions.

Specifically, the transistor 2 can further comprise a drain region 211 within the first intra-transistor well 204 at the top surface 220 of the substrate 201 adjacent to the first side 231 of the gate structure 230 and a source region 212 within the second intra-transistor well 207 at the top surface 220 of the substrate 201 adjacent to the second side 232 of the gate structure 230. The source region 212 and drain region 211 can be asymmetric with respect to the gate structure 230 and, specifically, the drain region 211 can be positioned farther from the gate structure 230 than the source region 212, as shown. The drain region 211 and the source region 212 can comprise doped regions having the first type conductivity at a relatively high conductivity level (e.g., a P+ drain region and a P+ source region).

The transistor 2 can further comprise an intra-transistor band 203 within the substrate 201. For purposes of this disclosure, an "intra-transistor band" refers to a band (i.e., a buried dopant implant region within the substrate and separated from the top surface by some predetermined distance) that is an active component of the transistor. The intra-transistor band 203 can be in the substrate 201 below and in contact with the first intra-transistor well 204 and the second intra-transistor well 207. This intra-transistor band 203 can have the first type conductivity (e.g., a P-band).

Additionally, a contact region 213 (also referred to herein as a body contact region), having the second type conductivity at a relatively high conductivity level (e.g., an N+ contact region), can be positioned within the second intra-transistor well 207 at the top surface 220 of the substrate 201 so as to allow that second intra-transistor well 207 to be electrically biased. Within the second intra-transistor well, the source region 212 can be positioned closer to the gate structure 230 than the contact region 213. The transistor 2 can further comprise another contact region 219, having the second type conductivity at a relatively high conductivity level (e.g., an N+ contact region), within the first intra-transistor well 204 at the top surface 220 of the substrate 201 so as to effectively form a junction field effect transistor. Within the first intra-transistor well 204, the contact region 219 can be positioned closer to the gate structure 230 than the drain region 211.

In any case, a patterned trench isolation structure 210 at the top surface 220 of the substrate 201 can electrically isolate the drain region 211, source region 212, and contact regions 213, 219. This trench isolation structure 210 can comprise, for example, a conventional shallow trench isolation (STI) structure) comprising a patterned trench, which is filled with one or more isolation materials (e.g., silicon dioxide ($SiO_2$), silicon nitride (SiN), silicon oxynitride (SiON), and/or any other suitable isolation material).

The semiconductor structure 200 can further comprise, within the substrate 201, a first isolation well 208, a second isolation well 209 and an isolation band 202. For purposes of this disclosure, an "isolation well refers" to a well (i.e., a dopant implant region) that electrically isolates adjacent devices and/or components thereof. Such isolation wells can be positioned at the top surface of the semiconductor substrate and can extend vertically into the semiconductor substrate some predetermined depth (e.g., the same predetermined depth 221 as the intra-transistor wells). For purposes of this disclosure, an "isolation band" refers to a band (i.e., a buried dopant implant region within the substrate and separated from the top surface by some predetermined distance), which electrically isolates devices and components thereof from the lower portion of the substrate.

Figure 5:
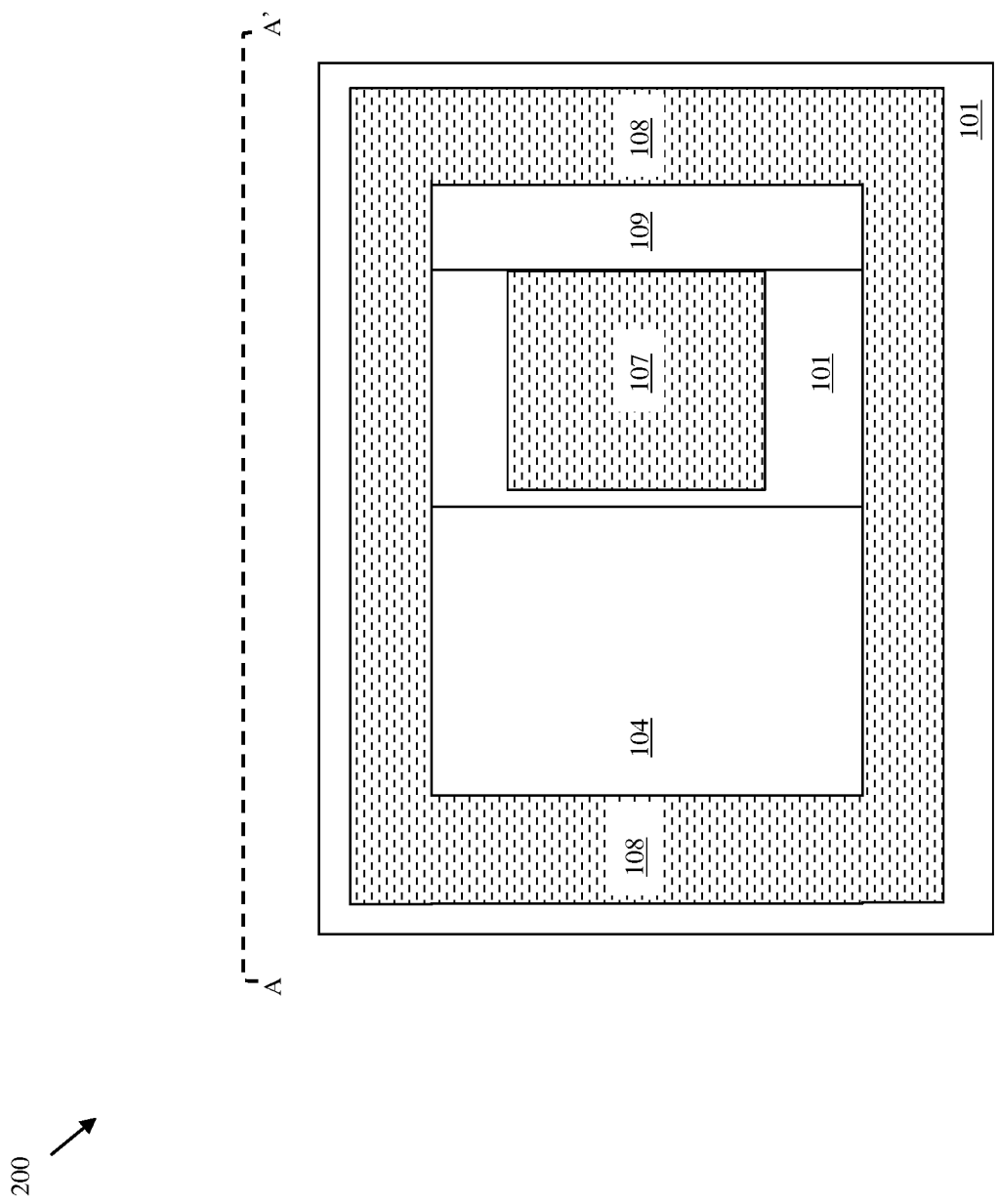
FIG. 5 is a horizontal cross-section diagram further illustrating the P-type lateral double-diffused metal oxide semiconductor field effect transistor of FIG. 4.

In this case, the first isolation well 208 can be positioned laterally around (i.e., can border) the transistor 2 (see the cross-section diagram of FIG. 5) and can have the second type conductivity (e.g., an N-type isolation well). The second isolation well 209 can be positioned laterally between the second intra-transistor well 207 and the first isolation well 208, can have the first type conductivity (e.g., a P-type isolation well) and can extend vertically to the intra-transistor band 203. The isolation band 202 can be below and in contact with the first isolation well 208 and the intra-transistor band 203. More specifically, the isolation band 202 can have vertical portion aligned below and in contact with the first isolation well 208. This vertical portion can further be positioned laterally around (i.e., can border) the intra-transistor band 203. Additionally, the isolation band 202 can have a horizontal portion that separates the bottom surface of the intra-transistor band 203 and the lower portion 291 of the substrate 201. This isolation band 202 can have the second type conductivity (e.g., an N-band). The isolation band 202 in combination with the first isolation well 208, which also has the second type conductivity, can electrically isolate the transistor 2 from the lower portion 291 of the substrate 201 and from any adjacent devices (not shown) on the substrate 201.

It should be noted that, optionally, the semiconductor structure 200 can further comprise an additional contact region 215 that allows the well 208 and, thereby the band 202 to be electrically biased. More specifically, the semiconductor structure 200 can further comprise a contact region 215, having the second conductivity type at a relatively high conductivity level (e.g., an N+ contact region), within the first isolation well 208 at the top surface 220 of the substrate 201 so as to allow that isolation well 208 and, thereby the band 202 below to be electrically biased. As with the other contact regions 213, 219, described above, the contact region 215 can be electrically isolated by the trench isolation region 210.

In such a semiconductor structure 200, the transistor 2 will have a fully-depleted deep drain drift region 250 located within the intra-transistor band 203 and first intra-transistor well 204 between contact region 219 and the isolation band 202. This fully-depleted drain drift region 250 will ensure that the transistor 2 has a relatively high blocking voltage. Furthermore, because the transistor 2 is electrically isolated by the first isolation well 208 and isolation band 202 from the lower portion 291 of the substrate 201 and from adjacent devices on the substrate 201, the transistor 2 can be placed in relatively close proximity to adjacent devices in order to increase device density on the substrate 201 with minimal risk of shorts.

Figure 6:
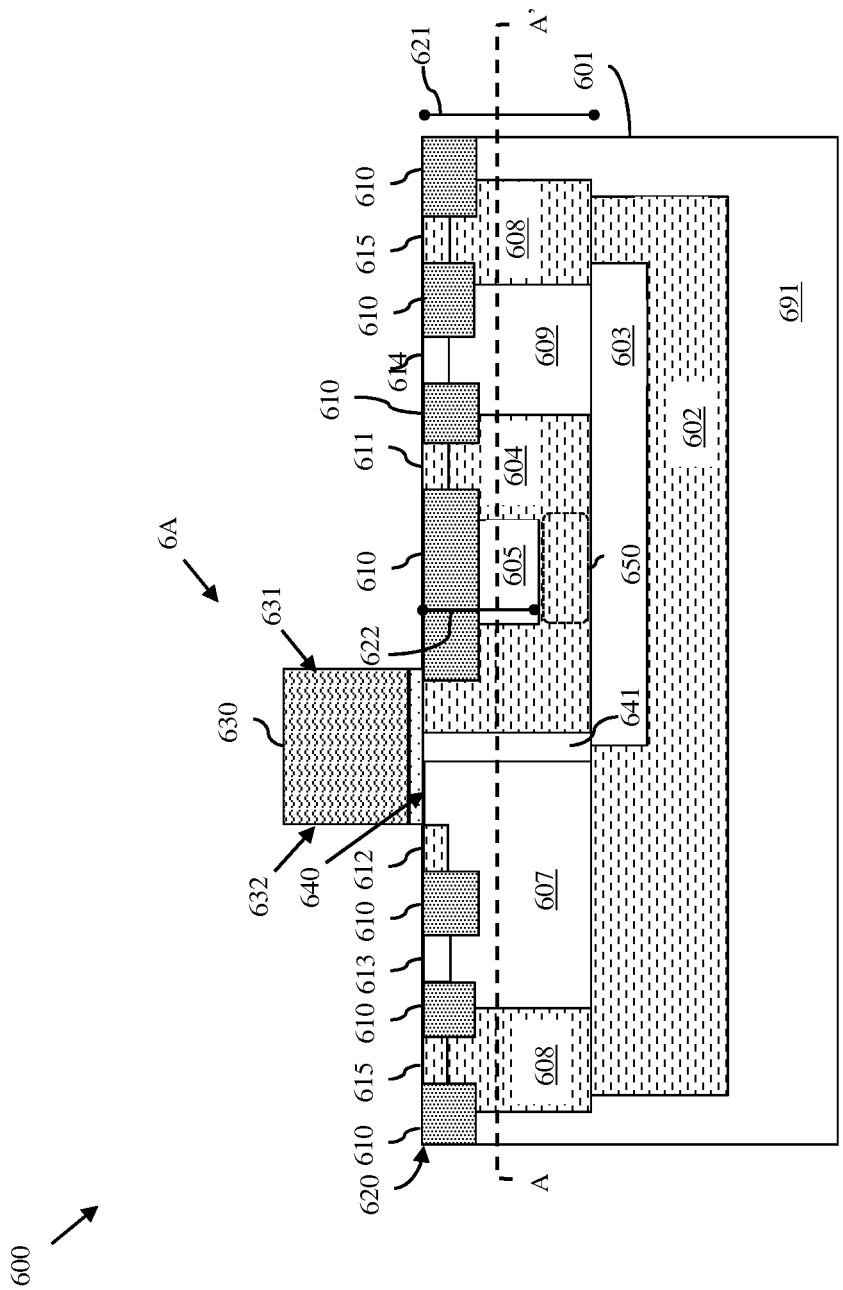
FIG. 6 is a vertical cross-section diagram illustrating an N-type lateral double-diffused metal oxide semiconductor field effect transistor.
Figure 7:
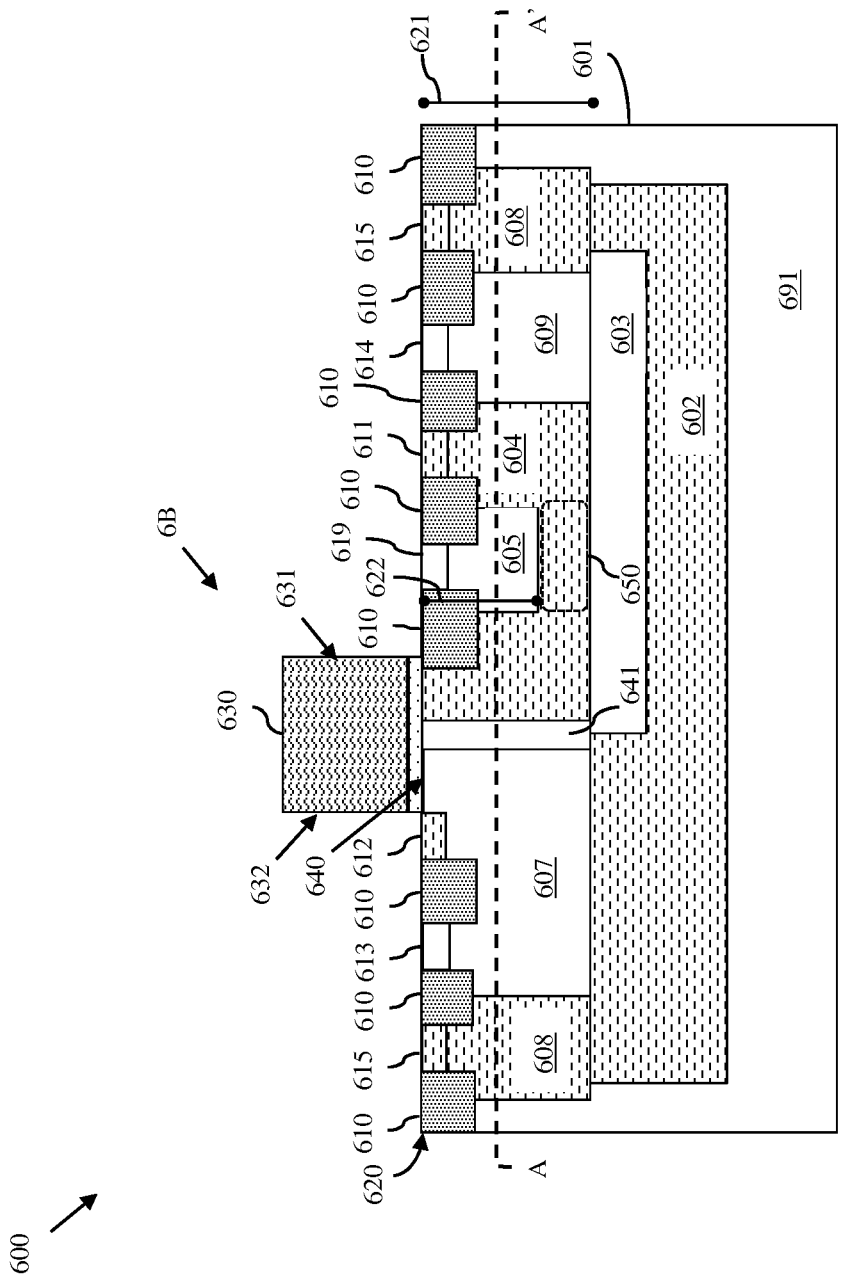
FIG. 7 is a vertical cross-section diagram illustrating another N-type lateral double-diffused metal oxide semiconductor field effect transistor.

Referring to FIGS. 6 and 7 disclosed herein is yet another semiconductor structure 600 comprising a bulk semiconductor substrate 601. For example, the semiconductor substrate 601 can comprise a bulk silicon substrate or any other bulk semiconductor substrate. The semiconductor substrate 601 can have a first type conductivity (e.g., P-type conductivity) at a relatively low conductivity level. For example, the semiconductor substrate 601 can comprise a P− substrate.

The semiconductor structure 600 can further comprise a transistor 6A, as in FIG. 6, or 6B, as in FIG. 7, on the semiconductor substrate 601 and, particularly, an N-type lateral double-diffused metal oxide semiconductor field effect transistor (NLDMOSFET) on the substrate 601.

Specifically, this transistor 6A, 6B can comprise plurality of intra-transistor wells within the substrate 601. For purposes of this disclosure, an "intra-transistor well" refers to a well (i.e., a dopant implant region), which is an active component of the transistor. These intra-transistor wells can comprise a first intra-transistor well 604 having a second type conductivity (e.g., an N-well); a second intra-transistor well 605 within the first intra-transistor well 604 and having the first type conductivity (e.g., a P-well); and a third intra-transistor well 607 positioned laterally adjacent to the first intra-transistor well 604 and having the first type conductivity (e.g., another P-well). In this case, the first intra-transistor well 604 and the third intra-transistor well 607 can extend a first depth 621 into the substrate 601 from the top surface 620, the second intra-transistor well 605 can extend a second depth 622 into the substrate 601 from the top surface 620 and the first depth 621 can be deeper than the second depth 622 (i.e., the second intra-transistor 605 well can be a more shallow well than the first and third intra-transistor wells).

It should be noted that the first intra-transistor well 604 can be physically separated from the third intra-transistor well 607 by a space 641, as shown. In this case, the space 641 between the first intra-transistor well 604 and third intra-transistor well 607 will have the same doping type and conductivity level as the lower portion 691 of the substrate 601 (e.g., P−). Alternatively, the first intra-transistor well 604 can be immediately adjacent to (i.e., can abut) the third intra-transistor well 607 (not shown).

The transistor 6 can further comprise a gate structure 630 on the top surface 620 of the substrate 601. A first side 631 of the gate structure 630 can extend laterally over the first intra-transistor well 604. A second side 632 of the gate structure 630 can extend laterally over the third intra-transistor well 607 and can define the channel region 640 of the transistor 6. The gate structure 630 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer.

The transistor 6 can further comprise, at the top surface 620 of the substrate 601 on either side of the gate structure 630, a drain region 611, a source region 612, various contact regions (e.g., 613 and, optionally, 619) and a trench isolation structure 610 that electrically isolates these regions.

Specifically, the transistor can comprise a drain region 611 within the first intra-transistor within the first intra-transistor well 604 at the top surface 620 of the substrate 601 adjacent to the first side 631 of the gate structure 630 and a source region 612 within the third intra-transistor well 607 at the top surface 620 of the substrate 601 adjacent to the second side 632 of the gate structure 630. The drain region 611 and source region 612 can be asymmetric with respect to the gate structure 630 and, specifically, the drain region 611 can be positioned farther from the gate structure 630 than the source region 612, as shown. The drain region 611 and the source region 612 can each have the second type conductivity at a relatively high conductivity level (e.g., a N+ drain region and a N+ source region).

Additionally, a contact region 613 (also referred to herein as a body contact region), having the first conductivity type at a relatively high conductivity level (e.g., a P+ contact region), can be positioned within the third intra-transistor well 607 at the top surface 620 of the substrate 601 so as to allow that third intra-transistor well 607 to be electrically biased. Within the third intra-transistor well 607, the source region 612 can be positioned closer to the gate structure 630 than the contact region 613. Optionally, as shown in FIG. 7, the transistor 6B can further comprise a contact region 619, having the first conductivity type at a relatively high conductivity level (e.g., another P+ contact region), within the second intra-transistor well 605 at the top surface 620 of the substrate 601 so as to effectively form a junction field effect transistor. Within the first intra-transistor well 604, the contact region 619 can be positioned closer to the gate structure 630 than the drain region 611.

In any case, a patterned trench isolation structure 610 at the top surface 620 of the substrate 601 can electrically isolate the drain region 611, source region 612, and contact regions (e.g., the contact region 613 and, if applicable, the contact region 619). This trench isolation structure 610 can comprise, for example, a conventional shallow trench isolation (STI) structure) comprising a patterned trench, which is filled with one or more isolation materials (e.g., silicon dioxide ($SiO_2$), silicon nitride (SiN), silicon oxynitride (SiON), and/or any other suitable isolation material).

The semiconductor structure 600 can further comprise, within the substrate 601, a first isolation band 603, a first isolation well 608, a second isolation well 609 and a second isolation band 602. For purposes of this disclosure, an "isolation well" refers to a well (i.e., a dopant implant region) that electrically isolates adjacent devices and/or components thereof. Such isolation wells can be positioned at the top surface of the semiconductor substrate and can extend vertically into the semiconductor substrate some predetermined depth (e.g., the same predetermined depth 621 as the first and third intra-transistor wells). For purposes of this disclosure, an "isolation band" refers to a band (i.e., a buried dopant implant region within the substrate and separated from the top surface by some predetermined distance), which electrically isolates devices and components thereof from the lower portion of the substrate.

Figure 8:
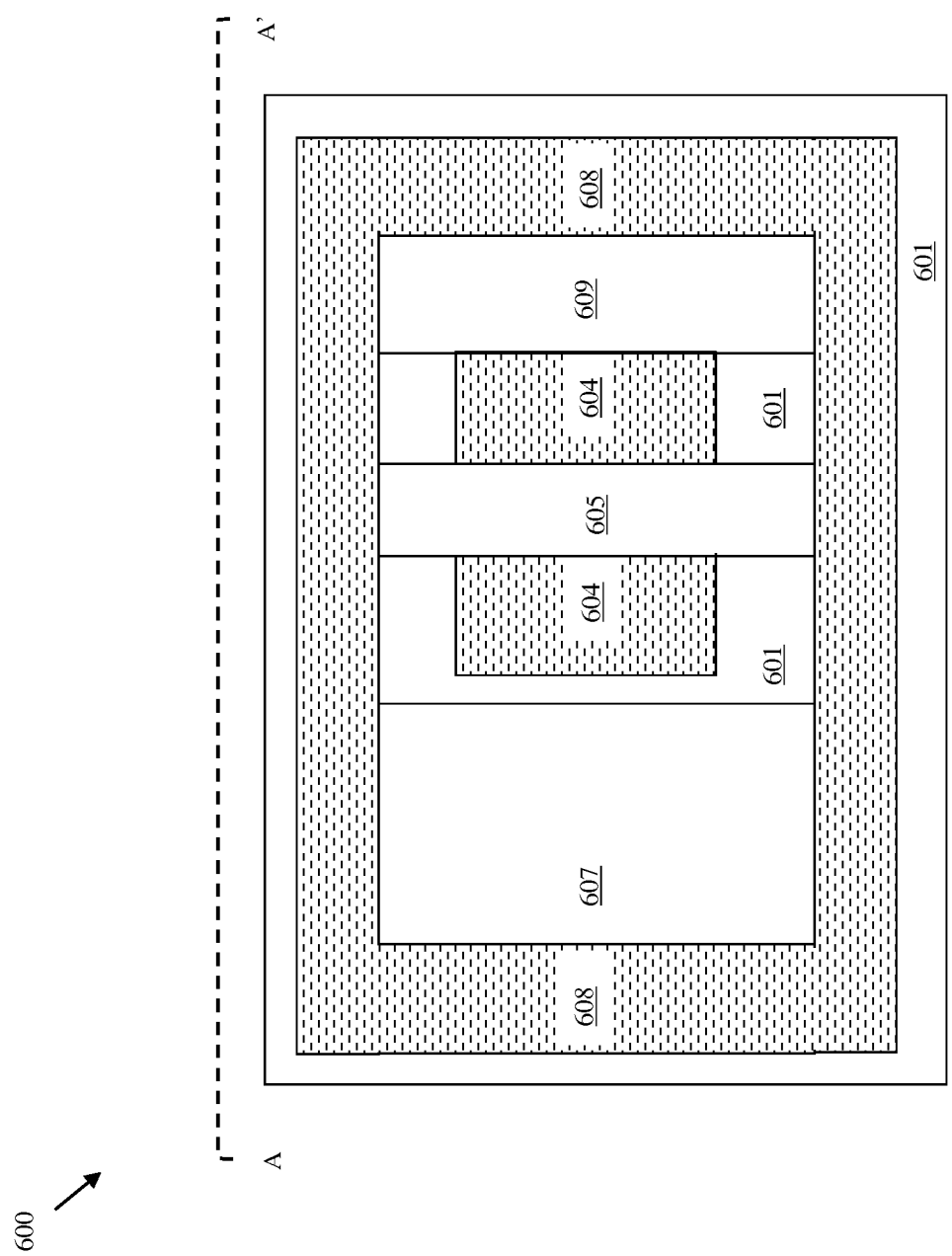
FIG. 8 is a horizontal cross-section diagram further illustrating the N-type lateral double-diffused metal oxide semiconductor field effect transistor of FIG. 6 or FIG. 7.

In this case, the first isolation band 603 can be positioned below and in contact with the first intra-transistor well 604. This first isolation band 603 can have the first type conductivity (e.g., a P-type isolation band). The first isolation well 608 can have the second type conductivity (e.g., an N-type isolation well) and can be positioned laterally around (i.e., can border) the transistor 6A, 6B (see the cross-section diagram of FIG. 8). The second isolation well 609 can have the first type conductivity (e.g., a P-type isolation well) and can be positioned laterally between the first isolation well 608 and the first intra-transistor well 604 of the transistor 6A, 6B and can extend vertically to the first isolation band 603. The second isolation band 602 can be below and in contact with the first isolation well 608, the first isolation band 603 and the third intra-transistor well 607 of the transistor 6A, 6B. More specifically, the second isolation band 602 can have a vertical portion aligned below and in contact with the first isolation well 608. Additionally, the second isolation band 602 can have a horizontal portion that separates the bottom surfaces of the first isolation band 603 and the third intra-transistor well 607 from the lower portion 691 of the substrate 601. The second isolation band 602 can have the second type conductivity (e.g., an N-type isolation band). The second isolation band 602 in combination with the first isolation well 608, which also has the second type conductivity, can electrically isolate the transistor 6A, 6B from the lower portion 691 of the substrate 601 and from any adjacent devices (not shown) on the substrate 601.

It should be noted that, optionally, the semiconductor structure 600 can further comprise additional contact regions 614 and 615 that allow the wells 609 and 608 and, thereby the bands 603 and 602, respectively, to be electrically biased. More specifically, the semiconductor structure 600 can further comprise a contact region 614, having the first conductivity type at a relatively high conductivity level (e.g., a P+ contact region), within the second isolation well 609 at the top surface 620 of the substrate 601 so as to allow that isolation well 609 and, thereby the band 603 below to be electrically biased. The semiconductor structure 600 can also further comprise a contact region 615, having the second conductivity type at a relatively high conductivity level (e.g., an N+ contact region), within the first isolation well 608 at the top surface 620 of the substrate 601 so as to allow that isolation well 608 and, thereby the band 602 below to be electrically biased. As with the other contact regions 613, 619, described above, the contact regions 614 and 615 can be electrically isolated by the trench isolation region 610.

In such a semiconductor structure 600, the transistor 6A, 6B will have a fully-depleted deep drain drift region 650 located within the first intra-transistor well 604 between the second intra-transistor well 605 and the first isolation band 603. This fully-depleted drain drift region 650 will ensure that the transistor 6A, 6B has a relatively high blocking voltage. Furthermore, because the transistor 6A, 6B is electrically isolated by the first isolation well 608 and isolation band 602 from the lower portion 691 of the substrate 601 and from adjacent devices on the substrate 601, the transistor 6A, 6B can be placed in relatively close proximity to adjacent devices in order to increase device density on the substrate 601 with minimal risk of shorts.

Figure 9:
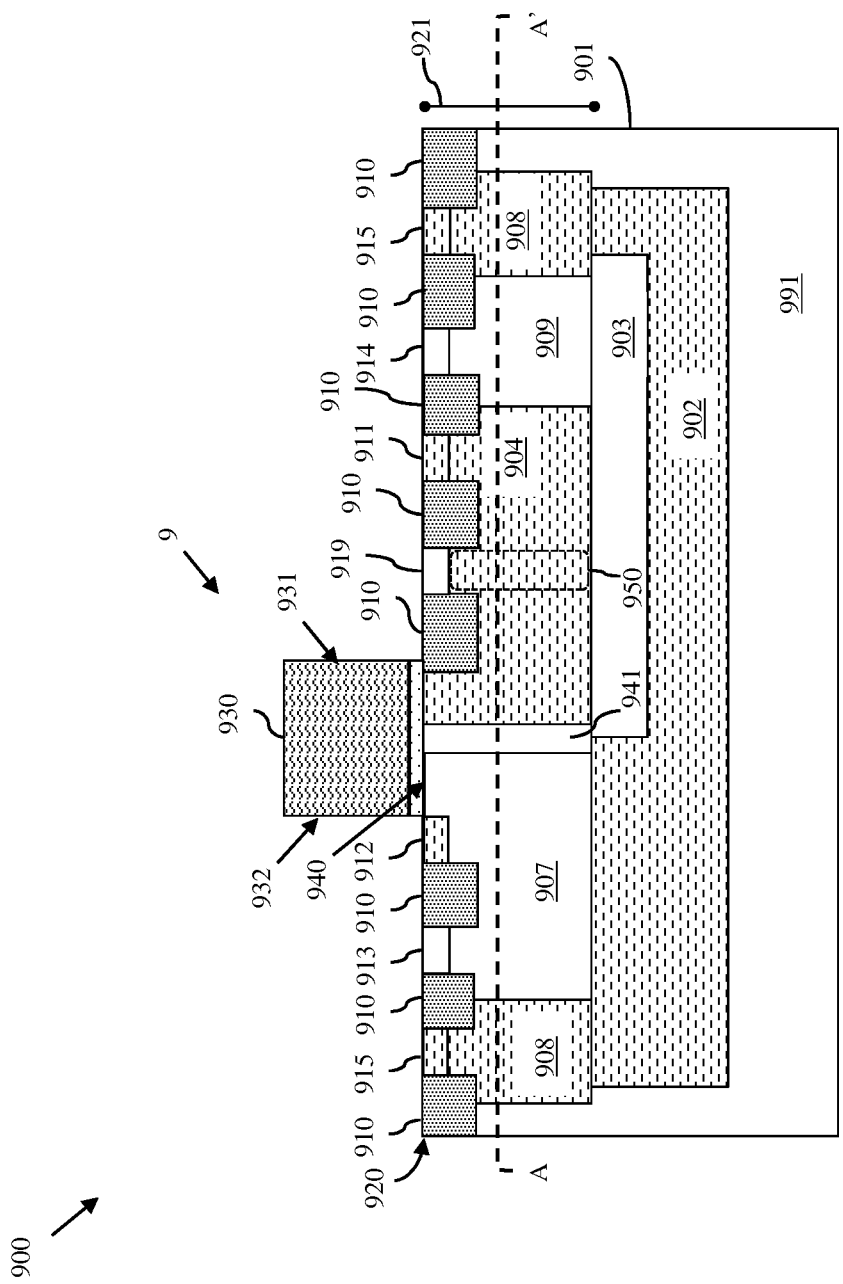
FIG. 9 is a vertical cross-section diagram illustrating yet another N-type lateral double-diffused metal oxide semiconductor field effect transistor.

Referring to FIG. 9 disclosed herein is yet another semiconductor structure 900 comprising a bulk semiconductor substrate 901. For example, the semiconductor substrate 901 can comprise a bulk silicon substrate or any other bulk semiconductor substrate. The semiconductor substrate 901 can have a first type conductivity (e.g., P-type conductivity) at a relatively low conductivity level. For example, the semiconductor substrate 901 can comprise a P− substrate.

The semiconductor structure 900 can further comprise a transistor 9 on the semiconductor substrate 901 and, particularly, an N-type lateral double-diffused metal oxide semiconductor field effect transistor (NLDMOSFET) on the substrate 901.

Specifically, this transistor 9 can comprise plurality of intra-transistor wells within the substrate 901. For purposes of this disclosure, an "intra-transistor well" refers to a well (i.e., a dopant implant region), which is an active component of the transistor. These intra-transistor wells can comprise a first intra-transistor well 904 having a second type conductivity (e.g., an N-well) and a second intra-transistor well 907 positioned laterally adjacent to the first intra-transistor well 904 and having the first type conductivity (e.g., a P-well). Each of these intra-transistor wells 904 and 907 can be positioned at the top surface 920 of the semiconductor substrate 901 and can extend vertically into the semiconductor substrate 901 some predetermined depth (e.g., a same predetermined depth 921).

It should be noted that the first intra-transistor well 904 can be physically separated from the second intra-transistor well 907 by a space 941, as shown. In this case, the space 941 between the first intra-transistor well 904 and second intra-transistor well 907 will have the same doping type and conductivity level as the lower portion 991 of the substrate 901 (e.g., P−). Alternatively, the first intra-transistor well 904 can be immediately adjacent to (i.e., can abut) the second intra-transistor well 907 (not shown).

The transistor 9 can further comprise a gate structure 930 on the top surface 920 of the substrate 901. A first side 931 of the gate structure 930 can extend laterally over the first intra-transistor well 904. A second side 932 of the gate structure 930 can extend laterally over the second intra-transistor well 907 and can define the channel region 940 of the transistor 9. The gate structure 930 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer.

The transistor 9 can further comprise, at the top surface 920 of the substrate 901 on either side of the gate structure 930, a drain region 911, a source region 612, various contact regions (e.g., 913 and 919) and a trench isolation structure 910 that electrically isolates these regions.

Specifically, the transistor 9 can comprise a drain region 911 within the first intra-transistor within the first intra-transistor well 904 at the top surface 920 of the substrate 901 adjacent to the first side 931 of the gate structure 930 and a source region 912 within the second intra-transistor well 907 at the top surface 920 of the substrate 901 adjacent to the second side 932 of the gate structure 930. The drain region 911 and source region 912 can be asymmetric with respect to the gate structure 930 and, specifically, the drain region 911 can be positioned farther from the gate structure 930 than the source region 912, as shown. The drain region 911 and the source region 912 can each have the second type conductivity at a relatively high conductivity level (e.g., a N+ drain region and a N+ source region).

Additionally, a contact region 913 (also referred to herein as a body contact region), having the first conductivity type at a relatively high conductivity level (e.g., a P+ contact region), can be positioned within the second intra-transistor well 907 at the top surface 920 of the substrate 901 so as to allow that second intra-transistor well 907 to be electrically biased. Within the second intra-transistor well, the source region 912 can be positioned closer to the gate structure 930 than the contact region 913. The transistor 9 can further comprise a contact region 919, having the first conductivity type at a relatively high conductivity level (e.g., another P+ contact region), within the first intra-transistor well 905 at the top surface 920 of the substrate 901 so as to effectively form a junction field effect transistor. Within the first intra-transistor well 904, the contact region 919 can be positioned closer to the gate structure 930 than the drain region 911.

In any case, a patterned trench isolation structure 910 at the top surface 920 of the substrate 901 can electrically isolate the drain region 911, source region 912, and contact regions 913, 919. This trench isolation structure 910 can comprise, for example, a conventional shallow trench isolation (STI) structure) comprising a patterned trench, which is filled with one or more isolation materials (e.g., silicon dioxide ($SiO_2$), silicon nitride (SiN), silicon oxynitride (SiON), and/or any other suitable isolation material).

The semiconductor structure 900 can further comprise, within the substrate 901, a first isolation band 903, a first isolation well 908, a second isolation well 909 and a second isolation band 902. For purposes of this disclosure, an "isolation well" refers to a well (i.e., a dopant implant region) that electrically isolates adjacent devices and/or components thereof. Such isolation wells can be positioned at the top surface of the semiconductor substrate and can extend vertically into the semiconductor substrate some predetermined depth (e.g., the same predetermined depth 921 as the first and second intra-transistor wells). For purposes of this disclosure, an "isolation band" refers to a band (i.e., a buried dopant implant region within the substrate and separated from the top surface by some predetermined distance), which electrically isolates devices and components thereof from the lower portion of the substrate.

Figure 10:
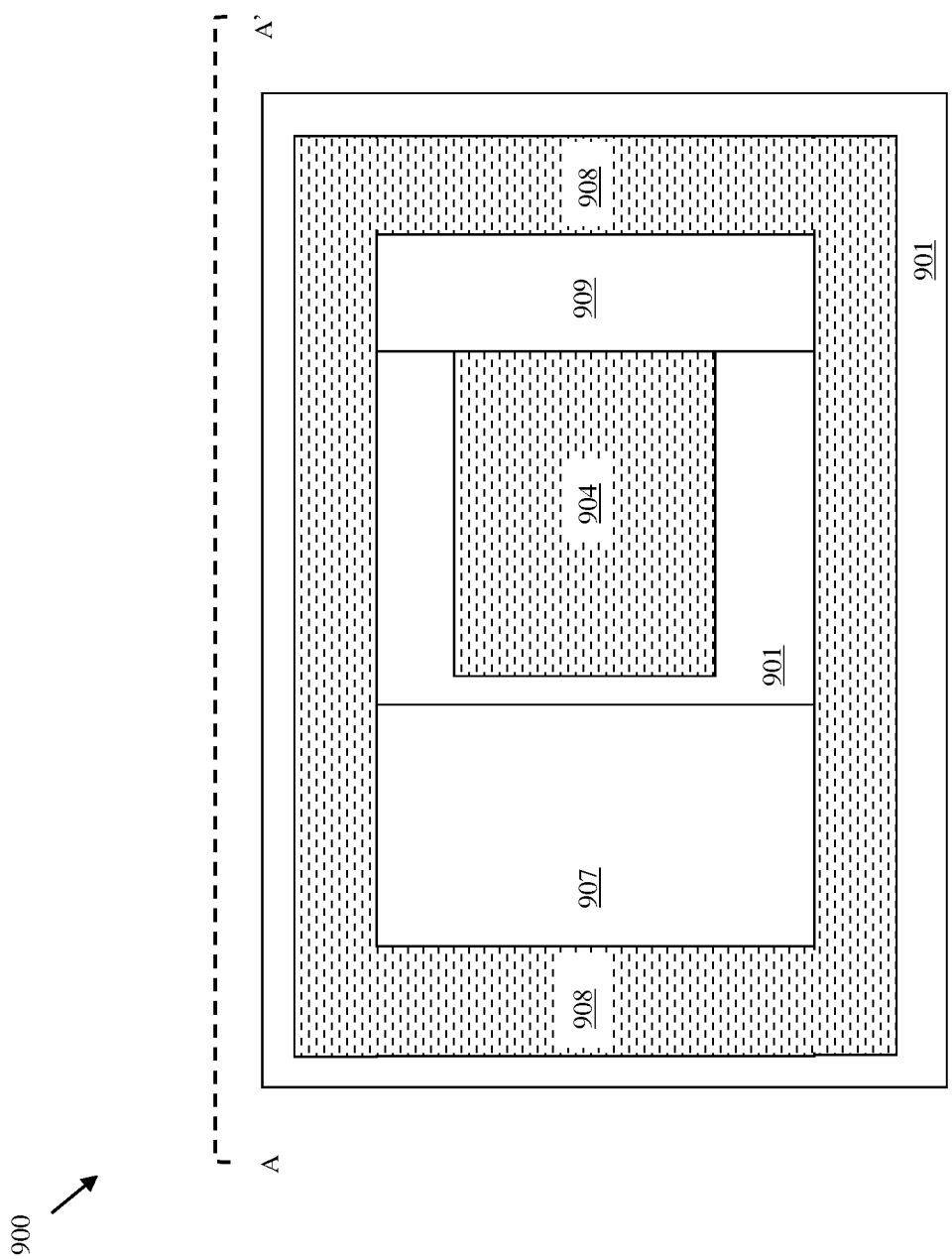
FIG. 10 is a horizontal cross-section diagram further illustrating the N-type lateral double-diffused metal oxide semiconductor field effect transistor of FIG. 9.

In this case, the first isolation band 903 can be positioned below and in contact with the first intra-transistor well 904. This first isolation band 903 can have the first type conductivity (e.g., a P-type isolation band). The first isolation well 908 can have the second type conductivity (e.g., an N-type isolation well) and can be positioned laterally around (i.e., can border) the transistor 9 (see the cross-section diagram of FIG. 10). The second isolation well 909 can have the first type conductivity (e.g., a P-type isolation well) and can be positioned laterally between the first isolation well 908 and the first intra-transistor well 904 of the transistor 9 and can extend vertically to the first isolation band 903. The second isolation band 902 can be below and in contact with the first isolation well 908, the first isolation band 903 and the second intra-transistor well 907 of the transistor 9. More specifically, the second isolation band 902 can have a vertical portion aligned below and in contact with the first isolation well 608. Additionally, the second isolation band 902 can have a horizontal portion that separates the bottom surfaces of the first isolation band 903 and the second intra-transistor well 907 from the lower portion 991 of the substrate 901. The second isolation band 902 can have the second type conductivity (e.g., an N-type isolation band). The second isolation band 902 in combination with the first isolation well 908, which also has the second type conductivity, can electrically isolate the transistor 9 from the lower portion 991 of the substrate 901 and from any adjacent devices (not shown) on the substrate 901.

It should be noted that, optionally, the semiconductor structure 900 can further comprise additional contact regions 914 and 915 that allow the wells 909 and 908 and, thereby the bands 903 and 902, respectively, to be electrically biased. More specifically, the semiconductor structure 900 can further comprise a contact region 914, having the first conductivity type at a relatively high conductivity level (e.g., a P+ contact region), within the second isolation well 909 at the top surface 920 of the substrate 901 so as to allow that isolation well 909 and, thereby the band 903 below to be electrically biased. The semiconductor structure 900 can also further comprise a contact region 915, having the second conductivity type at a relatively high conductivity level (e.g., an N+ contact region), within the first isolation well 908 at the top surface 920 of the substrate 901 so as to allow that isolation well 908 and, thereby the band 902 below to be electrically biased. As with the other contact regions 913, 919, described above, the contact regions 914 and 915 can be electrically isolated by the trench isolation region 910.

In such a semiconductor structure 900, the transistor 9 will have a fully depleted deep drain drift region 950 located within the first intra-transistor well 904 between contact region 919 and the first isolation band 903. This fully-depleted drain drift region 950 will ensure that the transistor 9 has a relatively high blocking voltage. Furthermore, because the transistor 9 is electrically isolated by the first isolation well 908 and isolation band 902 from the lower portion 991 of the substrate 901 and from adjacent devices on the substrate 901, the transistor 9 can be placed in relatively close proximity to adjacent devices in order to increase device density on the substrate 901 with minimal risk of shorts.

Also disclosed herein are semiconductor structures comprising multiple ones of the above-described transistors in either logic circuit (e.g., inverter) configuration or a stacked LDMOSFET configuration.

Figure 11:
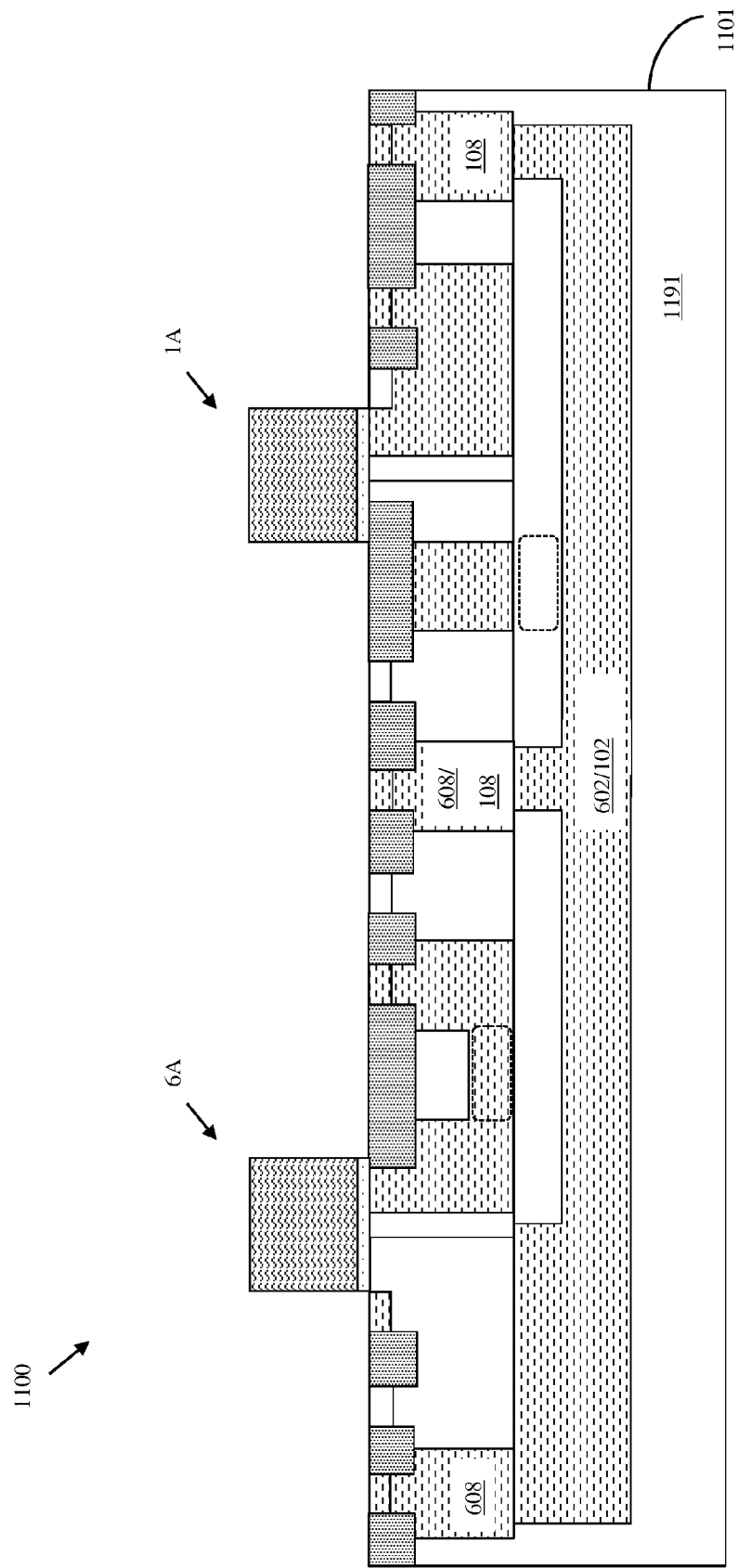
FIG. 11 is a vertical cross-section diagram illustrating an exemplary inverter comprising the transistors of FIGS. 1 and 6.

For example, FIG. 11 is a cross-section diagram illustrating a semiconductor structure 1100 wherein the transistor 1A of FIGS. 1 and 6A of FIG. 6 are arranged on the same substrate 1101 as a logic circuit (e.g., inverter) configuration. That is, the transistor 1A (e.g., a PLDMOSFET) is positioned laterally adjacent to the transistor 6A (e.g., an NLDMOSFET) on the same substrate 1101. It should be noted that in this case the transistors 1A and 6A can be laterally surrounded by isolation wells 108 and 608, respectively, having the second type conductivity, as discussed in detail above. However, the portion of these wells 108, 608 between the transistors 1A and 6A can be shared. Similarly, each transistor 1A and 6A can be electrically isolated from the lower portion 1191 of the semiconductor substrate 1101 below by isolation bands 102 and 602, respectively, having the second type conductivity, as discussed in detail above. However, these isolation bands 102, 602 can be continuous (i.e., can form adjacent portions of the same band that extends laterally under both transistors).

Figure 12:
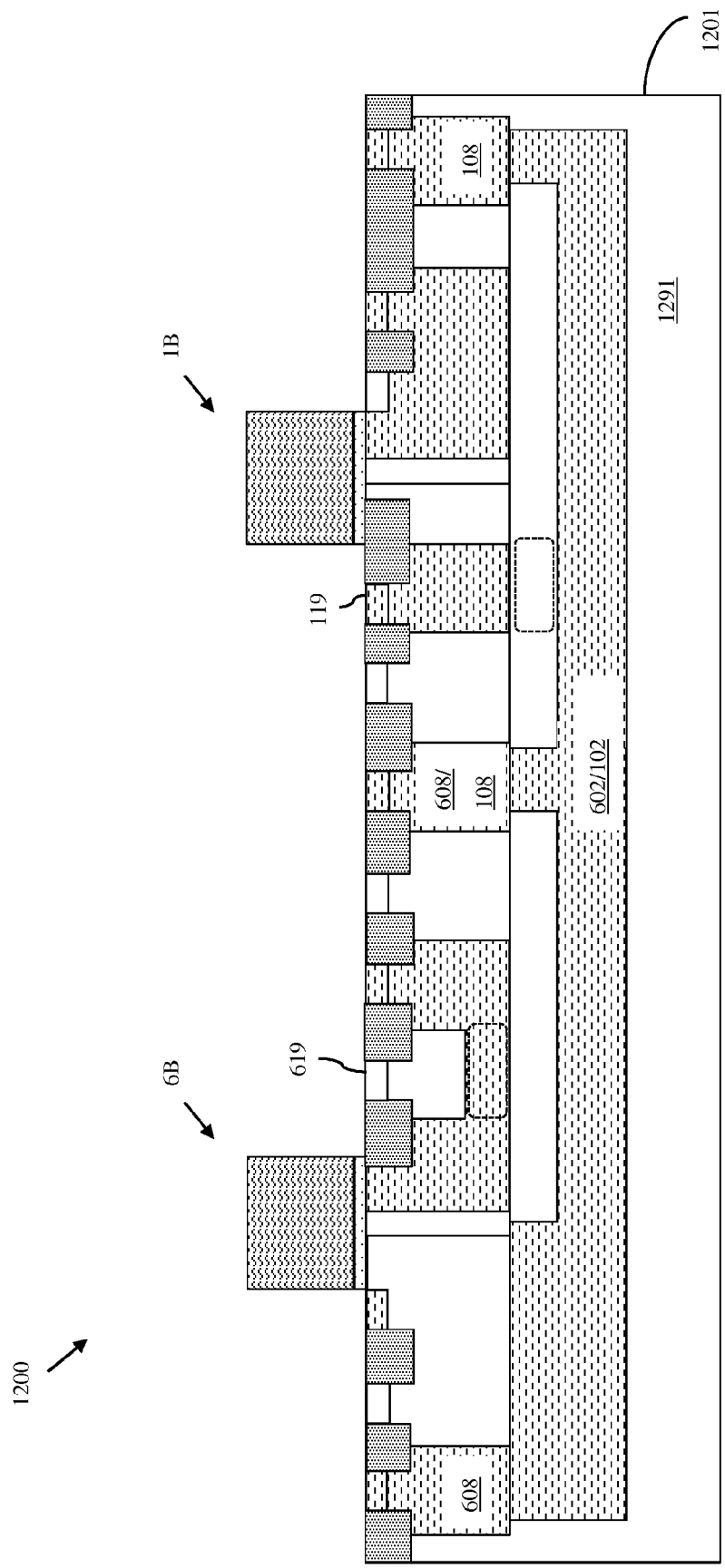
FIG. 12 is a vertical cross-section diagram illustrating another exemplary inverter comprising the transistors of FIGS. 2 and 7.

Similarly, FIG. 12 is a cross-section diagram illustrating a semiconductor structure 1200 wherein the transistor 1B of FIGS. 2 and 6B of FIG. 7 are arranged on the same substrate 1201 as a logic circuit (e.g., inverter) configuration. That is, the transistor 1B (e.g., a PLDMOSFET) is positioned laterally adjacent to the transistor 6B (e.g., an NLDMOSFET) on the same substrate 1201. It should be noted that in this case the transistors 1B and 6B can be laterally surrounded by isolation wells 108 and 608, respectively, having the second type conductivity, as discussed in detail above. However, the portion of these wells 108, 608 between the transistors 1B and 6B can be shared. Similarly, each transistor 1B and 6B can be electrically isolated from the lower portion 1291 of the semiconductor substrate 1201 below by isolation bands 102 and 602, respectively, having the second type conductivity, as discussed in detail above. However, these isolation bands 102, 602 can be continuous (i.e., can form adjacent portions of the same band that extends laterally under both transistors).

Figure 13:
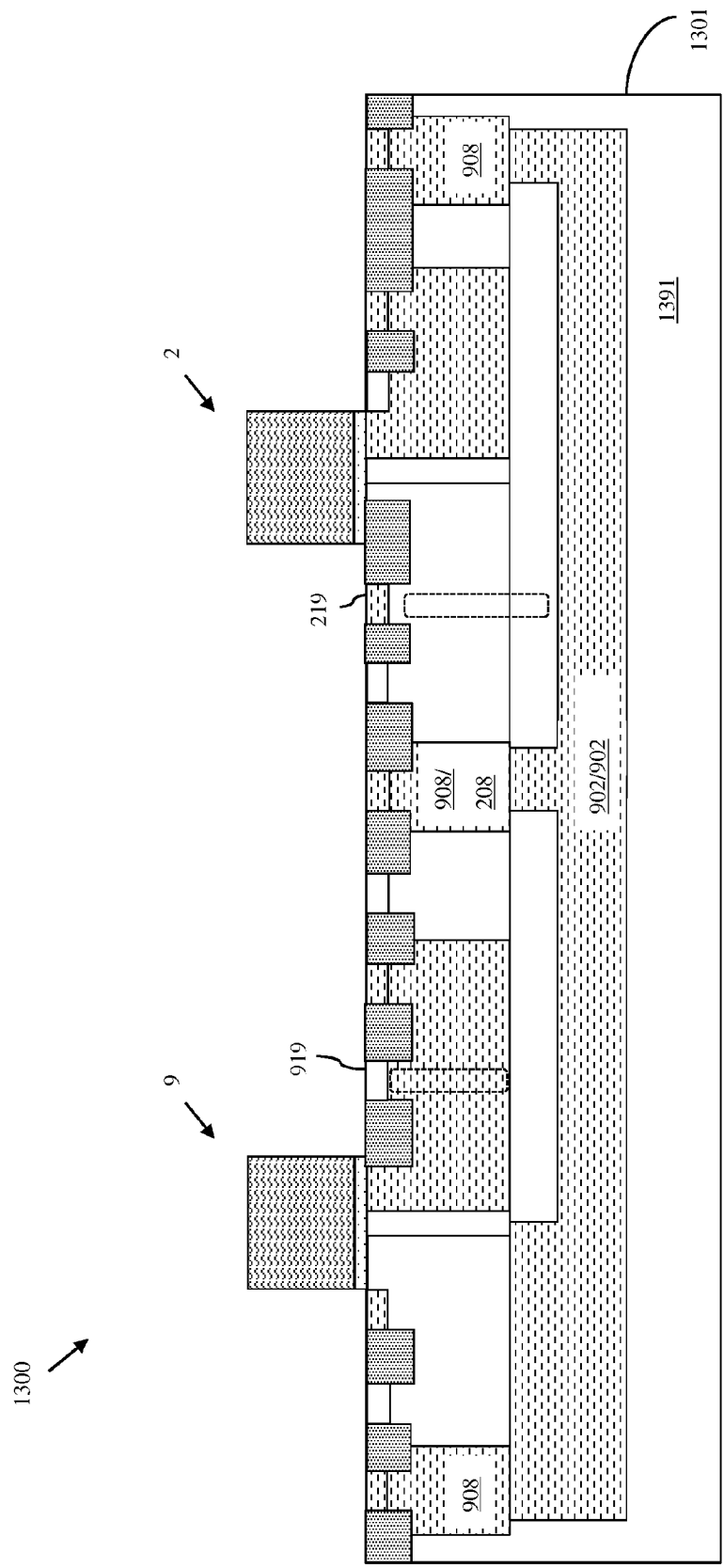
FIG. 13 is a vertical cross-section diagram illustrating yet another exemplary inverter comprising the transistors of FIGS. 4 and 9.

Similarly, FIG. 13 is a cross-section diagram illustrating a semiconductor structure 1300 wherein the transistor 2 of FIGS. 4 and 9 of FIG. 9 are arranged on the same substrate 1301 as a logic circuit (e.g., inverter) configuration. That is, the transistor 2 (e.g., a PLDMOSFET) is positioned laterally adjacent to the transistor 9 (e.g., an NLDMOSFET) on the same substrate 1301. It should be noted that in this case the transistors 2 and 9 can be laterally surrounded by isolation wells 208 and 908, respectively, having the second type conductivity, as discussed in detail above. However, the portion of these wells 208, 908 between the transistors 2 and 9 can be shared. Similarly, each transistor 2 and 9 can be electrically isolated from the lower portion 1391 of the semiconductor substrate 1301 below by isolation bands 202 and 902, respectively, having the second type conductivity, as discussed in detail above. However, these isolation bands 202, 902 can be continuous (i.e., can form adjacent portions of the same band that extends laterally under both transistors).

Figure 14:
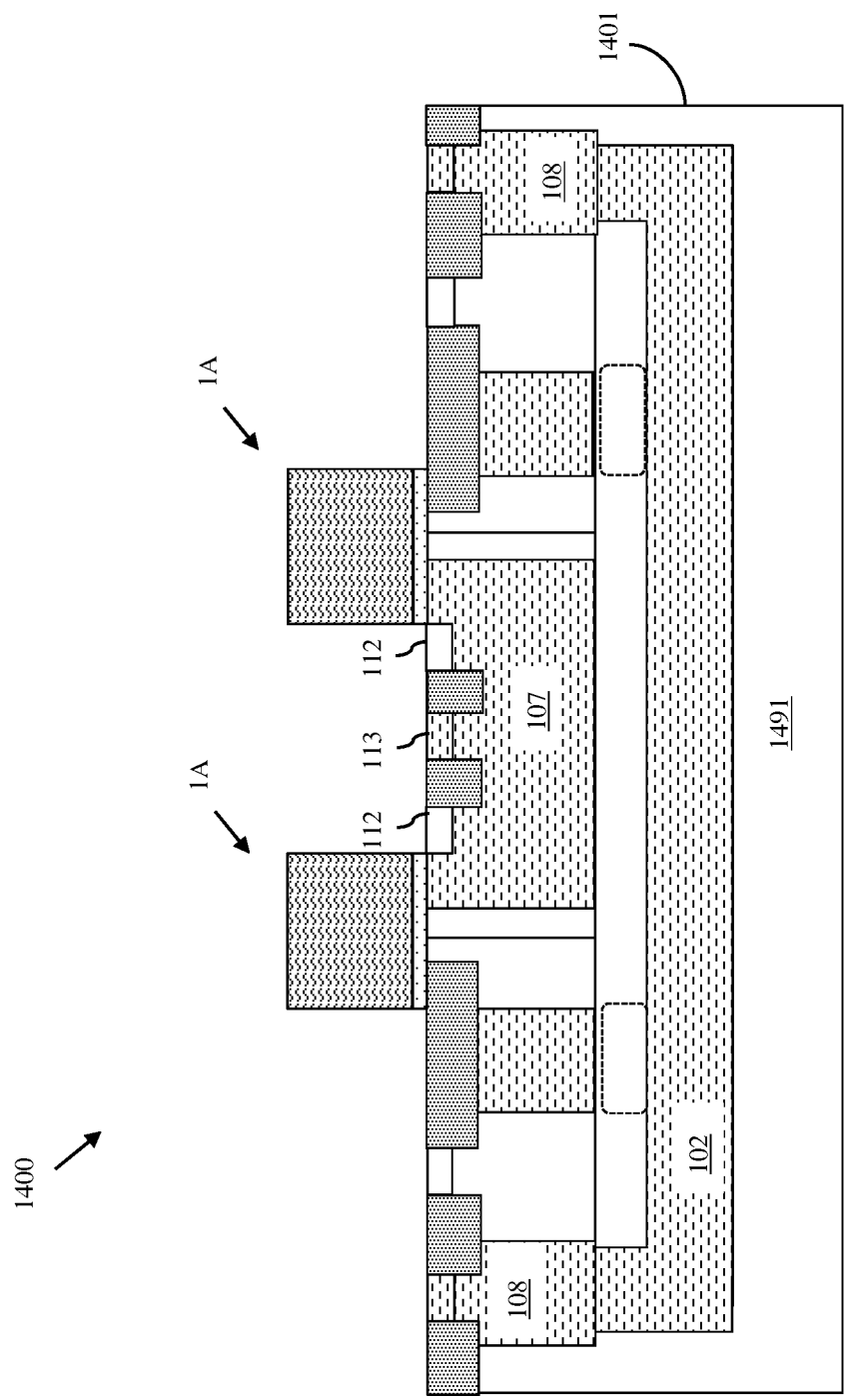
FIG. 14 is a vertical cross-section diagram illustrating two of the transistors of FIG. 1 stacked.

FIG. 14 is a cross-section diagram illustrating a semiconductor structure 1400 wherein two of transistors 1A of FIG. 1 (e.g., two PDLMOSFETs) are stacked together on the same substrate 1401. That is, a first transistor 1A is positioned laterally adjacent to another transistor 1A on the same substrate 1401. It should be noted that in this case two the transistors 1A can share a fourth intra-transistor well 107 (within which their respective source regions 112 are located) as well as the contact region 113 to that well 107. The two transistors 1A can be laterally surrounded by a single isolation well 108, having the second type conductivity, as discussed in detail above. Additionally, the two transistors 1A can be electrically isolated from the lower portion 1491 of the semiconductor substrate 1401 below by a single isolation band 102 that extends laterally below both transistors. It should be understood that the other disclosed LDMOSFETs 1B, 2, 6A, 6B and 9 can be stacked together in a similar manner.

Those skilled in the art will recognize that the above-described semiconductor structures can be formed using standard complementary metal oxide semiconductor (CMOS) fabrication processes. For example, multiple masked dopant implantation processes can be performed to create, within a bulk semiconductor substrate, the multiple discrete dopant implant regions (i.e., the various wells and bands described) having the desired conductivity type and level and as well as the relative positioning. Additional masked dopant implantation processes can be performed in order to form the source, drain and contact regions described. Alternatively, multiple in-situ doped epitaxial growth processes can be performed in order to form the source, drain and contact regions described.

Therefore, disclosed above are semiconductor structures. Each semiconductor structure can comprise a substrate and a laterally double-diffused metal oxide semiconductor field effect transistor (LDMOSFET) on the substrate. Each LDMOSFET can have a fully-depleted deep drain drift region (i.e., a fully depleted deep ballast resistor region) for providing a relatively high blocking voltage. Different configurations for the drain drift regions are disclosed and these different configurations can also vary as a function of the conductivity type of the LDMOSFET. Additionally, each semiconductor structure can comprise an isolation band positioned below the LDMOSFET and an isolation well positioned laterally around the LDMOSFET and extending vertically to the isolation band such that the LDMOSFET is electrically isolated from both a lower portion of the substrate and any adjacent devices on the substrate.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented above for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor substrate having a top surface and a first type conductivity;
   a transistor on said substrate, said transistor comprising:
   a first intra-transistor well in said substrate and having said first type conductivity;
   a second intra-transistor well in said substrate, positioned laterally adjacent to said first intra-transistor well and having a second type conductivity;
   a third intra-transistor well in said substrate, positioned laterally adjacent to said second intra-transistor well and having said first type conductivity;
   a fourth intra-transistor well in said substrate, positioned laterally adjacent to said third intra-transistor well and having said second type conductivity;
   a drain region within said first intra-transistor well at said top surface of said substrate, said drain region having said first type conductivity;
   a source region within said fourth intra-transistor well at said top surface of said substrate, said source region having said first type conductivity; and
   an intra-transistor band in said substrate below and in contact with said first intra-transistor well, said second intra-transistor well, said third intra-transistor well and said fourth intra-transistor well, said intra-transistor band having said first type conductivity;
   a first isolation well positioned laterally around said transistor and having said second type conductivity;
   a second isolation well positioned laterally between said fourth intra-transistor well and said first isolation well, said second isolation well having said first type conductivity and extending vertically to said intra-transistor band; and,
   an isolation band in said substrate and having said second type conductivity, said isolation band being below said isolation well and said intra-transistor band such that said transistor is electrically isolated from a lower portion of said substrate,
   said intra-transistor band having a drain drift region between said third intra-transistor well and said isolation band.

2. The semiconductor structure of claim 1, said drain drift region being fully depleted.

3. The semiconductor structure of claim 1, further comprising a gate structure on said top surface closer to said source region than said drain region, said gate structure having a first side above said third intra-transistor well and a second side above said fourth intra-transistor well.

4. The semiconductor structure of claim 1, said third intra-transistor well being any one of immediately adjacent to said fourth intra-transistor well and physically separated from said fourth intra-transistor well.

5. The semiconductor structure of claim 1, further comprising a contact region having said second type conductivity within said second intra-transistor well at said top surface of said substrate.

6. The semiconductor structure of claim 1, said transistor comprising a P-type transistor.

7. The semiconductor structure of claim 6, further comprising an N-type transistor on said substrate positioned laterally adjacent to said first isolation well, said isolation band extending laterally below said N-type transistor.

* * * * *